United States Patent
Ikezaki

(10) Patent No.: US 6,703,834 B2
(45) Date of Patent: Mar. 9, 2004

(54) SYSTEMS AND METHODS FOR CORRECTING PHASE ERRORS

(75) Inventor: Yoshikazu Ikezaki, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/116,479

(22) Filed: Apr. 4, 2002

(65) Prior Publication Data

US 2002/0167319 A1 Nov. 14, 2002

(30) Foreign Application Priority Data

Apr. 5, 2001 (JP) ........................................ 2001-106712

(51) Int. Cl.⁷ ................................................ G01V 3/00
(52) U.S. Cl. ....................................................... 324/307
(58) Field of Search .................................. 324/307, 309

(56) References Cited

U.S. PATENT DOCUMENTS

| | | |
|---|---|---|
| 5,023,554 A | 6/1991 | Cho et al. |
| 5,084,818 A | 1/1992 | Machida |
| 5,341,099 A * | 8/1994 | Suzuki ........................ 324/309 |
| 5,545,993 A * | 8/1996 | Taguchi et al. .............. 324/309 |
| 5,572,124 A * | 11/1996 | Bito et al. .................... 324/307 |
| 5,581,184 A * | 12/1996 | Heid ........................... 324/309 |
| 5,729,139 A | 3/1998 | Goto |
| 5,732,701 A | 3/1998 | Yoshitome et al. |
| 5,800,354 A | 9/1998 | Hofland et al. |
| 5,909,119 A | 6/1999 | Zhang et al. |
| 5,928,146 A * | 7/1999 | Itagaki et al. ................ 600/410 |
| 6,025,714 A | 2/2000 | Avram et al. |
| 6,057,686 A * | 5/2000 | Van Den Brink et al. .. 324/309 |
| 6,076,006 A * | 6/2000 | Van Den Brink et al. .. 600/419 |
| 6,118,273 A * | 9/2000 | Takizawa et al. ........... 324/309 |
| 6,144,202 A * | 11/2000 | Kanazawa et al. .......... 324/309 |
| 6,169,398 B1 | 1/2001 | Watanabe et al. |
| 6,201,393 B1 | 3/2001 | Bernstein et al. |
| 6,249,595 B1 | 6/2001 | Foxall et al. |
| 6,265,873 B1 | 7/2001 | Le Roux |
| 6,433,547 B2 * | 8/2002 | Kabasawa et al. .......... 324/314 |
| 6,528,996 B1 * | 3/2003 | Sato ............................ 324/307 |
| 6,541,970 B1 * | 4/2003 | Takizawa et al. ........... 324/309 |

* cited by examiner

*Primary Examiner*—Diego Gutierrez
*Assistant Examiner*—Dixomara Vargas
(74) *Attorney, Agent, or Firm*—Carl B. Horton, Esq.; Armstrong Teasdale LLP

(57) ABSTRACT

To correct motion and magnetic field inhomogeneity phase errors, inverting data collecting read gradients Nr1 and Nr2 are applied to collect correcting data H (n, 1) and H (n, 2) corresponding to focused navigation echoes Ne1 and Ne2, data collecting read gradients r1, . . . , rM which are inverted alternately are applied, and phase encode gradients pdn, p2, . . . , pM are applied at inverting, thereby collecting imaging data F (n, 1), . . . , F (n, M) corresponding to the focused imaging echoes e1, . . . , eM. This sequence is repeated for n=1, . . . , N while changing the magnitude of the phase encode gradient pdn, whereby data F (1, 1) to F (N, M) for filling a k space are collected. Based on the correcting data H (n, 1) and H (n, 2), the imaging data F (n, 1), . . . , F (n, M) are phase corrected.

25 Claims, 22 Drawing Sheets

SYSTEMS AND METHODS FOR CORRECTING PHASE ERRORS

BACKGROUND OF THE INVENTION

The present invention relates to a phase correction method and an MRI (Magnetic Resonance Imaging) system, more specifically, to a phase correction method and an MRI system which can correct motion phase errors and simplify the pulse sequence.

FIG. 18 shows a basic example of a pulse sequence of a multishot diffusion enhancement EPI (Echo Planar Imaging) method.

In the pulse sequence, an excitation pulse RF90 and a slice gradient SG90 are applied. An MPG (Motion Probing Gradient) pulse MPG is then applied. An inverting RF pulse RF180 and a slice gradient SG180 are applied. An MPG pulse MPG is then applied. A phase encode gradient pdn is applied. Data collecting read gradients r1 ... rM which are alternately inverted to be positive or negative are applied continuously, phase encode gradients p2, ..., pM are applied at inverting, and they are sampled by being timed to successively focus the first echo e1 to the Mth echo eM so as to collect data $F(n, 1), \ldots, F(n, M)$ corresponding to the echoes e1, ..., eM. This is repeated for $n \times 1, \ldots, N$ while changing the magnitude of the phase encode gradient pdn, to thereby collect data $F(1, 1)$ to $F(N, M)$ for filling the k space. This is called N shot and M echo. A number n given to a shot in the order of execution time is called a shot number. A number given to the echo of the echo train of a certain shot in the order of focusing time is called an echo number.

FIG. 19 is a schematic diagram showing collection trajectories of data $F(1, 1)$ to $F(N, M)$ in a k space KS, where N=4 and M=4.

When the k space KS is divided in the phase encode axis direction from the first line to the N×Mth line (or to the 16th line in FIG. 19), phase encodes pdn, p2, ..., pM are applied so as to collect data $F(n, m)$ of the $(n+(m-1)N)$th line by the Mth echo of the nth shot.

As shown in FIG. 20, the k space KS can be successively divided into blocks from the first echo block filled by data $F(n, 1)$ obtained from the first echo of the first to the Nth shot, to the Mth echo block (M=4 in FIG. 20) filled by data $F(n, M)$ obtained from the Mth echo of the shots.

Phase errors which are a problem in the pulse sequence of the multishot diffusion enhancement EPI method include a motion phase error caused by motion (for example, a pulse of a brain) and a magnetic field inhomogeneity error caused by magnetic field inhomogeneity.

The magnitude of the motion phase error periodically fluctuates in synchronization with, e.g., a pulse. In other words, the motion phase error fluctuates by the magnitude which cannot be ignored at relatively long time intervals between the shots. The motion phase error is changed only by the degree which can be ignored within a relatively short time such as an echo train of one shot. The motion phase errors of the same shot number n can thus be regarded as the same magnitude although the echo number m is different.

The magnitude of the magnetic field inhomogeneity phase error is increased in proportion to time from the excitation pulse RF90. In other words, the magnetic field inhomogeneity phase error is increased in proportion to the echo number m. Time to the echo number m from the excitation pulse RF90 is the same or is slightly different (there are the cases that the time is the same and that the time is slightly different) although the shot number n is different. The magnetic field inhomogeneity phase error of the echo number m can be regarded as the same magnitude although the shot number n is different.

FIG. 21 is an explanatory view showing phase errors of data $F(n, m)$ according to a basic example of the pulse sequence of the multishot diffusion enhancement EPI method of FIG. 18.

After the motion phase error is synthesized with the magnetic field inhomogeneity phase error, the phase errors are stepwise and periodical, causing ghost artifacts.

Like the pulse sequence shown in FIG. 22, a navigation phase encode gradient Nr is applied before the phase encode gradient pdn of the pulse sequence (the basic example) of FIG. 18 so as to focus a navigation echo Ne and to collect correcting data $H(n)$ from the navigation echo Ne.

A phase difference between the correcting data $H(n)$ of the shots represents a difference between the motion phase errors of the shots. Based on the correcting data $H(n)$, imaging data $F(n, 1)$ to $F(n, m)$ of the same shot are phase corrected to correct the motion phase errors.

FIG. 23 is an explanatory view showing phase errors of data $F'(n, m)$ after phase correction.

Imaging data $F(1, 1)$ to $F(4, 4)$ are phase corrected (indicated by the black-headed arrows) so that the phase of correcting data $H(1)$ of the first shot is matched with the phase of correcting data $H(2)$ of the second shot to the phase of correcting data $H(4)$ of the fourth shot. This can correct the motion phase errors and can suppress ghost artifacts as compared with the case of FIG. 23.

Since the magnetic field inhomogeneity phase errors remain, a phase difference is caused between the echo blocks. The ghost artifacts cannot be removed completely.

The pulse sequence of FIG. 18, because of the motion phase errors and the magnetic field inhomogeneity phase errors, has a problem of causing ghost artifacts.

The pulse sequence of FIG. 22, because of the magnetic field inhomogeneity phase errors, has a problem that ghost artifacts cannot be removed completely. The navigation echo Ne and the imaging echoes from e1 to em are independent. The pulse sequence is complex and the control is thus complicated.

SUMMARY OF THE INVENTION

Therefore, a first object of the present invention is to provide a phase correction method and an MRI system which can correct motion phase errors and can simplify the pulse sequence.

In addition to the first object, a second object of the present invention is to provide a phase correction method and an MRI system which can correct magnetic field inhomogeneity phase errors.

In a first aspect, the present invention provides a phase correction method including: repeating by N shots a pulse sequence in which when a k space is divided in the phase encode axis direction from the first line to the N=Mth (N and M are a natural number of 2 or more) line, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse; collecting diffusion enhancement imaging data for filling the k space from the imaging echo; collecting correcting data from the navigation echo; and phase correcting the imaging data based on the correcting data.

In the phase correction method of the first aspect, since the correcting data collected for each of the shots corrects the phase of the imaging data of the same shot, the motion phase errors can be corrected. In addition; the navigation echo is focused so as to be an echo train continuous to the imaging echo. The applying pattern of data collecting read gradients can be simplified and the pulse sequence can be simplified.

In a second aspect, the present invention provides the phase correction method thus constructed, wherein two or more navigation echoes are provided to one shot, and the polarity of the data collecting read gradient corresponding to imaging data is matched with the polarity of the data collecting read gradient corresponding to correcting data for use in phase correction of the imaging data.

In the phase correction method of the second aspect, the polarity of the data collecting read gradient corresponding to imaging data is matched with the polarity of the data collecting read gradient corresponding to correcting data for use in phase correction of the imaging data. Proper correction can thus be performed as compared with the case that the polarities are different. In addition, two or more navigation echoes and imaging echoes successively correspond with each other for phase correction. A difference can be eliminated with the same number of echo blocks as the number of the navigation echoes as a unit.

In a third aspect, the present invention provides the phase correction method thus constructed, wherein two or more navigation echoes are provided to one shot, a correction amount of a motion phase error is determined from the phase of the navigation echo of the shots, and a correction amount of a magnetic field inhomogeneity phase error is determined from a phase difference between the navigation echoes of the shots.

In the phase correction method of the third aspect, each correcting data is collected from two or more navigation echoes, and a correction amount of a motion phase error and a correction amount of a magnetic field inhomogeneity phase error are determined. Both the motion phase error and the magnetic field inhomogeneity phase error can thus be corrected.

In a fourth aspect, the present invention provides the phase correction method thus constructed, wherein the imaging data is phase corrected so that the phase errors of the imaging data are smoothly changed in the phase encode axis direction from the first line to the N×Mth line.

In the phase correction method of the fourth aspect, the phase errors of the imaging data are smoothly changed in the phase encode axis direction. Ghost artifacts can thus be removed.

In a fifth aspect, the present invention provides the phase correction method thus constructed, wherein the imaging data is phase corrected so that the phase errors of the imaging data are the same in the phase encode axis direction from the first line to the N×Mth line.

In the phase correction method of the fifth aspect, the phase errors of the imaging data are the same in the phase encode axis direction. Thus, ghost artifacts can be removed and shifting of an image is suppressed.

In a sixth aspect, the present invention provides the phase correction method thus constructed, wherein one navigation echo is provided to one shot, and a correction amount of a motion phase error is determined from the phase of the navigation echo of the shots.

In the phase correction method of the sixth aspect, correcting data is collected from one navigation echo so as to determine a correction amount of a motion phase error. The motion phase error can thus be corrected. In addition, the pulse sequence can be simplified.

In a seventh aspect, the present invention provides a phase correction method including: repeating by N shots a pulse sequence in which when a k space is divided in the phase encode axis direction from the first line to the N×Mth (N and M are a natural number of 2 or more) line, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse; collecting diffusion enhancement imaging data for filling the k space from the imaging echo; collecting correcting data from the navigation echo; collecting referring data corresponding to the imaging data and correcting data from a referring echo focused by executing a referring pulse sequence omitting the phase encode gradient and MPG pulse from the pulse sequence; phase correcting the imaging data based on the corresponding referring data; phase correcting the correcting data based on the corresponding referring data; and phase correcting imaging data phase—corrected by the referring data based on correcting data phase—corrected by the referring data.

In the phase correction method of the seventh aspect, referring data collected by executing a referring pulse sequence phase—corrects imaging data and correcting data. Phase errors caused by the magnetic field inhomogeneity, system, and shifting of the echo center can thus be corrected. Further, since the correcting data collected for each of the shots corrects the phase of the imaging data of the same shot, the motion phase errors can be corrected. In other words, both the motion phase error and the magnetic field inhomogeneity phase error can be corrected. In addition, the navigation echo is focused so as to be an echo train continuous to the imaging echo. The applying pattern of data collecting read gradients can be simplified and the pulse sequence can be simplified.

In an eighth aspect, the present invention provides the phase correction method thus constructed, wherein two or more navigation echoes are provided to one shot, and the polarity of the data collecting read gradient corresponding to imaging data is matched with the polarity of the data collecting read gradient corresponding to correcting data for use in phase correction of the imaging data.

In the phase correction method of the eighth aspect, the polarity of the data collecting read gradient corresponding to imaging data is matched with the polarity of the data collecting read gradient corresponding to correcting data for use in phase correction of the imaging data. Proper correction can thus be performed as compared with the case that the polarities are different.

In a ninth aspect, the present invention provides the phase correction method thus constructed, wherein the imaging data is phase corrected so that the phase errors of the imaging data are the same in the phase encode axis direction from the first line to the N×Mth line.

In the phase correction method of the ninth aspect, the phase errors of the imaging data are the same in the phase encode axis direction. Thus, ghost artifacts can be removed and shifting of an image is suppressed.

In a tenth aspect, the present invention provides the phase correction method thus constructed, wherein one navigation echo is provided to one shot, and a correction amount of a motion phase error is determined from the phase of the navigation echo of the shots.

In the phase correction method of the tenth aspect, since one navigation echo is provided, the pulse sequence can be simplified.

In an eleventh aspect, the present invention provides an MRI system including: RF pulse transmitting means; gradient pulse application means; NMR signal receiving means; data collection control means for controlling those means, repeating by N shots a pulse sequence in which when a k space is divided in the phase encode axis direction from the first line to the N×Mth (N and M are a natural number of 2 or more) line, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse, collecting diffusion enhancement imaging data for filling the k space from the imaging echo, and collecting correcting data from the navigation echo; correction arithmetic operation means for phase correcting the imaging data based on the correcting data; and reconstruction arithmetic operation means for reconstructing an image from the imaging data after correction arithmetic operation.

The MRI system of the eleventh aspect can preferably execute the phase correction method of the first aspect.

In a twelfth aspect, the present invention provides the MRI system thus constructed, wherein the data collection control means provides two or more navigation echoes to one shot, and the correction arithmetic operation means matches the polarity of the data collecting read gradient corresponding to imaging data with the polarity of the data collecting read gradient corresponding to correcting data for use in phase correction of the imaging data.

The MRI system of the twelfth aspect can preferably execute the phase correction method of the second aspect.

In a thirteenth aspect, the present invention provides the MRI system thus constructed, wherein the data collection control means provides two or more navigation echoes to one shot, and the correction arithmetic operation means determines a correction amount of a motion phase error from the phase of the navigation echo of the shots and determines a correction amount of a magnetic field inhomogeneity phase error from a phase difference between the navigation echoes of the shots.

The MRI system of the thirteenth aspect can preferably execute the phase correction method of the third aspect.

In a fourteenth aspect, the present invention provides the MRI system thus constructed, wherein the correction arithmetic operation means phase corrects the imaging data so that the phase errors of the imaging data are smoothly changed in the phase encode axis direction from the first line to the N×Mth line.

The MRI system of the fourteenth aspect can preferably execute the phase correction method of the fourth aspect.

In a fifteenth aspect, the present invention provides the MRI system thus constructed, wherein the correction arithmetic operation means phase corrects the imaging data so that the phase errors of the imaging data are the same in the phase encode axis direction from the first line to the N×Mth line.

The MRI system of the fifteenth aspect can preferably execute the phase correction method of the fifth, aspect.

In a sixteenth aspect, the present invention provides the MRI system thus constructed, wherein the data collection control means provides one navigation echo to one shot, and the correction arithmetic operation means determines a correction amount of a motion phase error from the phase of the navigation echo of the shots.

The MRI system of the sixteenth aspect can preferably execute the phase correction method of the sixth aspect.

In a seventeenth aspect, the present invention provides an MRI system including: RF pulse transmitting means; gradient pulse application means; NMR signal receiving means; data collection control means for controlling those means, repeating by N shots a pulse sequence in which when a k space is divided in the phase encode axis direction from the first line to the N×Mth (N and M are a natural number of 2 or more) line, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse, collecting diffusion enhancement imaging data for filling the k space from the imaging echo, collecting correcting data from the navigation echo, and collecting referring data corresponding to the imaging data and correcting data from a referring echo focused by executing a referring pulse sequence omitting the phase encode gradient and MPG pulse from the pulse sequence; correction arithmetic operation means for phase correcting the imaging data based on the corresponding referring data, phase correcting the correcting data based on the corresponding referring data, and phase correcting imaging data phase—corrected by the referring data based on correcting data phase—corrected by the referring data; and reconstruction arithmetic operation means for reconstructing an image from the imaging data after correction arithmetic operation.

The MRI system of the seventeenth aspect can preferably execute the phase correction method of the seventh aspect.

In an eighteenth aspect, the present invention provides the MRI system thus constructed, wherein the data collection control means provides two or more navigation echoes to one shot, and the correction arithmetic operation means matches the polarity of the data collecting read gradient corresponding to imaging data with the polarity of the data collecting read gradient corresponding to correcting data for use in phase correction of the imaging data.

The MRI system of the eighteenth aspect can preferably execute the phase correction method of the eighth aspect.

In a nineteenth aspect, the present invention provides the MRI system thus constructed, wherein the data collection control means provides one navigation echo to one shot so as to determine a correction amount of a motion phase error from the phase of the navigation echo of the shots.

The MRI system of the nineteenth aspect can preferably execute the phase correction method of the ninth aspect.

According to the phase correction method and the MRI system of the present invention, motion phase errors can be corrected and the pulse sequence can be simplified. Magnetic field inhomogeneity phase errors can be also corrected.

Further objects and advantages of the present invention will be apparent from the following description of the preferred embodiments of the invention as illustrated in the accompanying drawings.

DETAILED DESCRIPTION OF THE INVENTION

Figure 1:
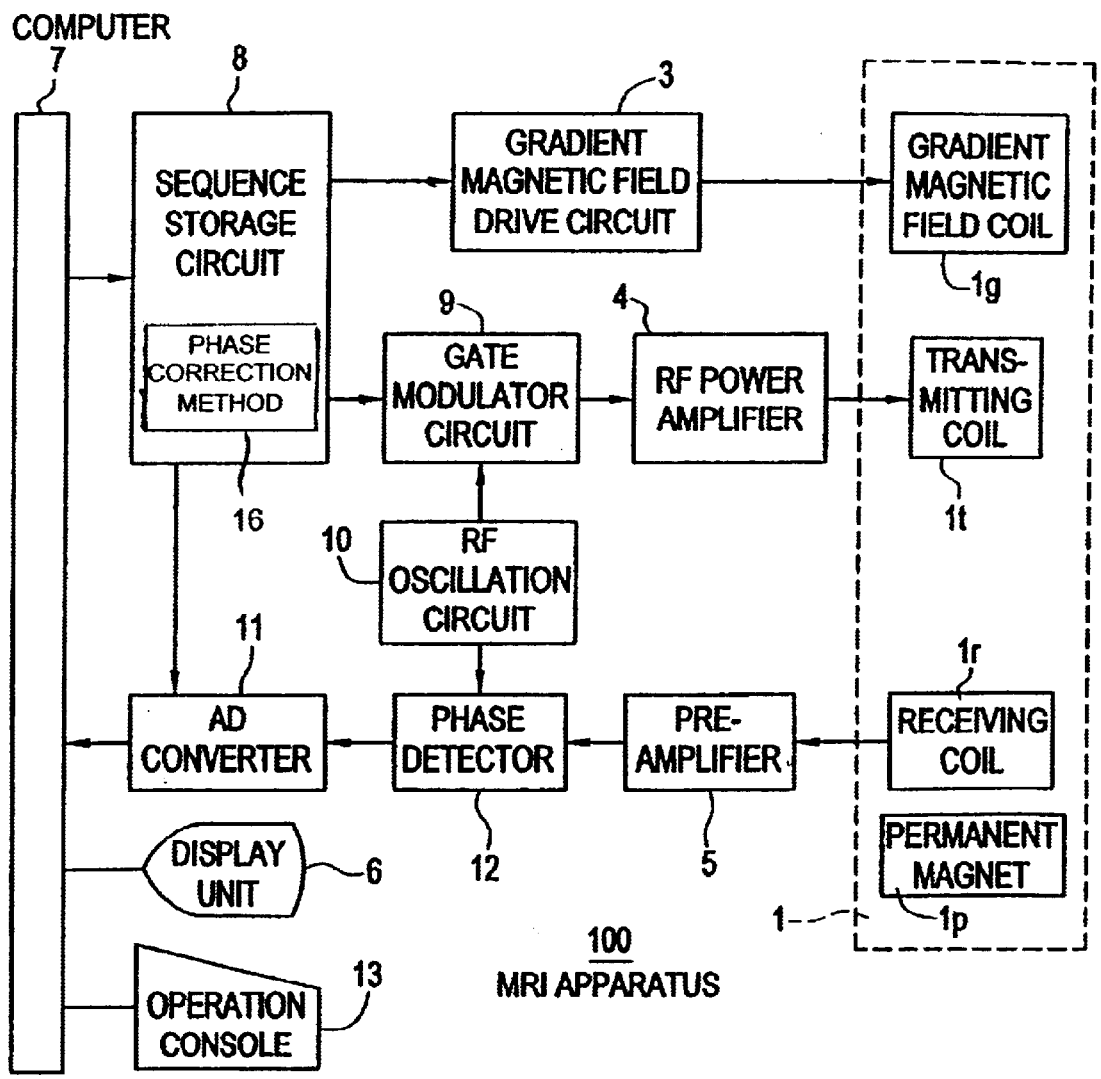
FIG. 1 is a block diagram of an MRI system according to a first embodiment.

The present invention will be described herein below in greater detail with embodiments shown in the drawings.

FIRST EMBODIMENT

FIG. 1 is a block diagram of an MRI system according to one embodiment of the present invention.

In an MRI system 100, a magnet assembly 1 has a space portion (hole) for inserting a subject thereinto and arranges in such a manner as to surround the space portion, a permanent magnet 1p for applying a constant main magnetic field to the subject, a gradient magnetic field coil 1g for producing a gradient magnetic field (the gradient magnetic field coil is provided with x-, y-, and z-axis coils, and a combination of these determines a slice axis, a read axis, and a phase encode axis), a transmitting coil 1t for transmitting an RF pulse for exciting the nuclear spins in the subject, and a receiving coil 1r for receiving an NMR signal from the subject. The gradient magnetic field coil 1g, the transmitting coil 1t, and the receiving coil 1r are respectively connected to a gradient magnetic field driving circuit 3, an RF power amplifier 4, and a preamplifier 5. In place of the permanent magnet 1p, a superconducting magnet may be employed.

A computer 7 creates a pulse sequence and passes it to a sequence storage circuit 8 for storing the pulse sequence as a portion of a phase correction method 16.

The sequence storage circuit 8 stores the pulse sequence, and operates the gradient magnetic field driving circuit 3 based on the pulse sequence to produce a gradient magnetic field from the gradient magnetic field coil 1g of the magnet assembly 1. The sequence storage circuit 8 operates a gate modulator circuit 9 to modulate a carrier wave output signal of an RF oscillation circuit 10 to a pulse-like signal of a predetermined timing and a predetermined envelope shape. Then, the pulse-like signal is added as an RF pulse to the RF power amplifier 4 and is power amplified by the RF power amplifier 4 so as to be applied to the transmitting coil 1t of the magnet assembly 1.

The preamplifier 5 amplifies an NMR signal received by the receiving coil 1r of the magnet assembly 1 and inputs the amplified signal to a phase detector 12. The phase detector 12 phase-detects the NMR signal with the carrier wave output signal of the RF oscillation circuit 10 as a reference signal and gives the signal to an AD converters 11. The AD converter 11 converts the NMR signal as an analog signal to data as a digital signal and inputs the data to the computer 7.

The computer 7 reads the data from the AD converter 11, and performs a phase correction process and an image reconstructing process to create an image. The image is displayed on a display unit 6.

The computer 7 also takes charge of the whole control including reception of information inputted from a console 13.

Figure 2:
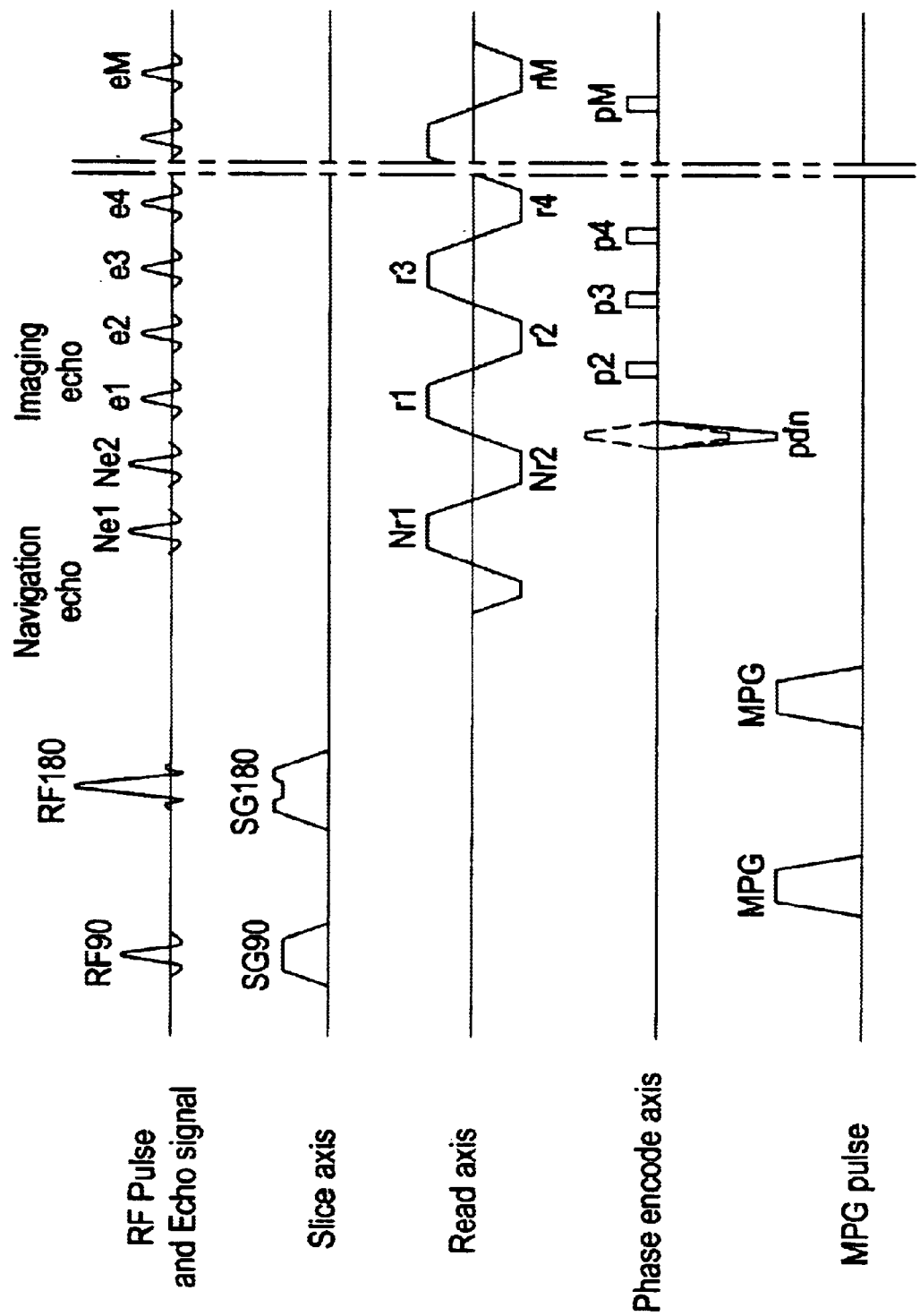
FIG. 2 is a pulse sequence diagram of a multishot diffusion enhancement EPI method according to the first embodiment.

FIG. 2 is a pulse sequence diagram of the multishot diffusion enhancement EPI method according to a first embodiment of the present invention.

In the pulse sequence, an excitation pulse RF90 and a slice gradient SG90 are applied. An MPG pulse MPG is then applied. An inverting RF pulse RF180 and a slice gradient SG180 are applied. An MPG pulse MPG is then applied. Data collecting read gradients Nr1, ..., NrJ (J≧1. J=2 in FIG. 2) which are alternately inverted to be positive or negative are applied continuously, and are sampled by being timed to successively focus the first navigation echo Ne1 to the Jth navigation echo NeJ so as to collect correcting data H (n, 1), ..., H (n, J) corresponding to the navigation echoes Ne1, ..., NeJ. Data collecting read gradients r1, ..., rM which are alternately inverted to be positive or negative are applied continuously, and phase encode gradients pdn, p2, ..., pM are applied at inverting, so that they are sampled by being timed to successively focus the first echo e1 to the Mth echo eM so as to collect data F (n, 1), ..., F (n, M)

corresponding to the echoes e1, . . . , eM. This is repeated for n=1, . . . , N while changing the magnitude of the phase encode gradient pdn to collect data F (1, 1) to F (N, M) for filling the k space.

Figure 3:
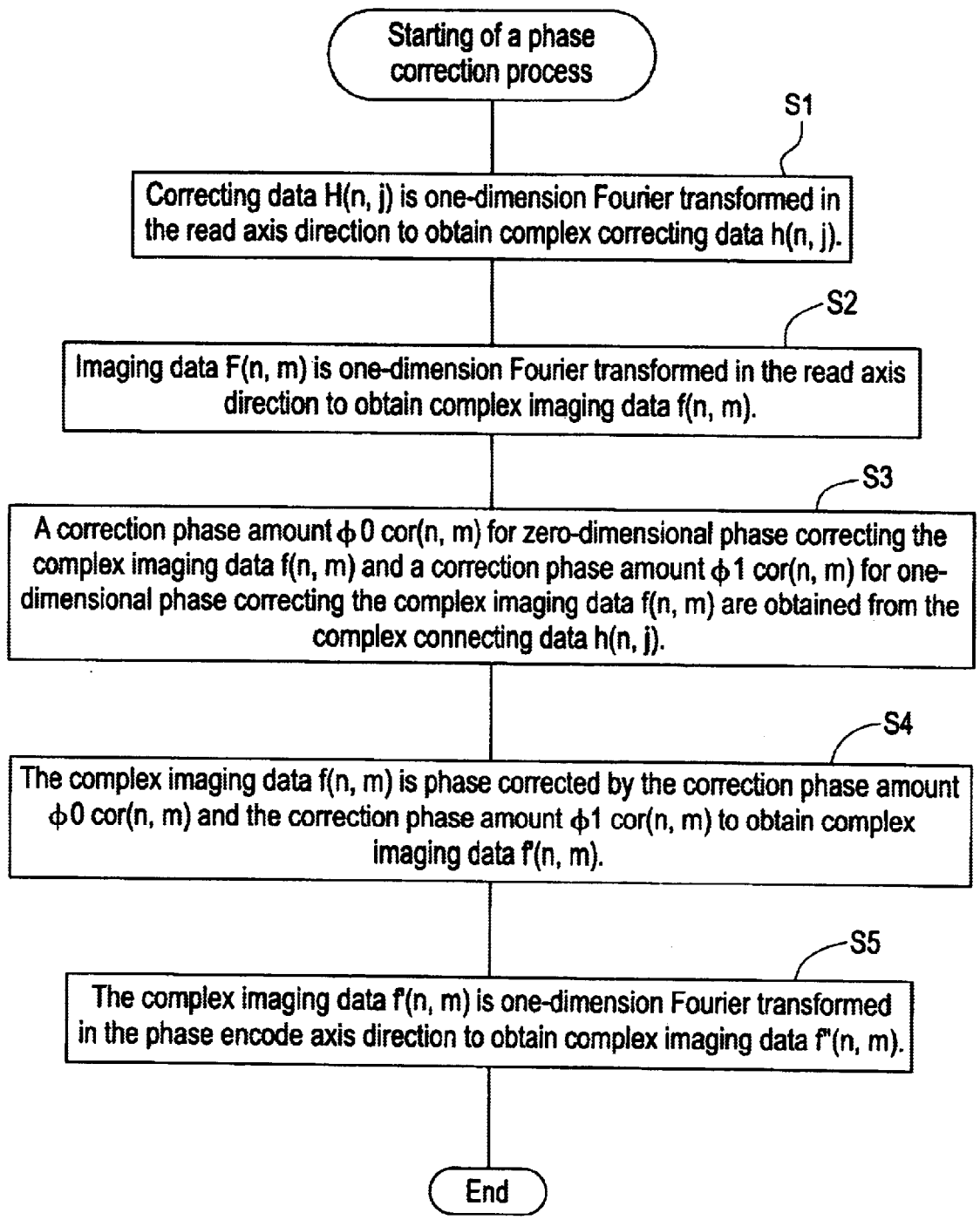
FIG. 3 is flowchart showing a phase correction process according to the first embodiment.

FIG. 3 is a flowchart showing a phase correction process according to the first embodiment.

In step S1, the correcting data H (n, j) is one-dimension Fourier transformed in the read axis direction to obtain complex correcting data h (n, j)

In step S2, the imaging data F (n, m) is one-dimension Fourier transformed in the read axis direction to obtain complex imaging data f (n, m).

In step S3, a correction phase amount $\phi 0$ cor (n, m) for zero-dimensional phase correcting the complex imaging data f (n, m) and a correction phase amount $\phi 1$ cor (n, m) for one-dimensional phase correcting the complex imaging data f (n, m) are obtained from the complex correcting data h (n, j).

Specifically, for example, when with J=2, $\phi 0$ NAV (n, 1) is a zero-dimensional phase determined from the complex correcting data h (n, 1), $\phi 1$ NAV (n, 2) is a one-dimensional phase determined from the complex correcting data h (n, 2), a phase difference between both ($\phi 0$ NAV (n, 2)-$\phi 0$ NAV (n, 1)) is $\phi$Block (n), and a magnetic field inhomogeneity phase error unit correction amount is $\phi$block (n =$\phi$Block (n) or $\phi$block (n)=av {$\phi$Block (1), . . . , $\phi$Block (N)} or $\phi$block (n)=max {$\phi$Block (1), . . . , $\phi$Block (N)} (provided that av { } is a function for determining an average, and max { } is a function for taking out a maximum value), Equation 1

$\phi 0$ cor (n, m)=$\phi 0$ NAV (n, (m−1)%2+1)−$\phi$block×(n−1)/N−$\phi$block× (m−1) %2

(% is an operator for obtaining a remainder after division)

Equation 2

$\phi 1$ cor (n, m)=$\phi 1$ NAV (n, (m−1) %2+1)

In step S4, the complex imaging data f (n, m) is phase corrected using the $\phi 0$ cor (n, m) and $\phi 1$ cor (n, m) to obtain complex imaging data f' (n, m).

Specifically, considering index l (l=1 to L) of a sampling point of the complex imaging data f (n, m), complex imaging data f (l, n, m) is phase corrected to obtain complex imaging data f' (l, n, m) as follows:

Equation 3 f'(l, n, m)=f(l, n, m)×exp {−j($\phi 0$ cor (n, m)+$\phi 1$ cor (n, m)×l)}

In step S5, the complex imaging data f' (n, m) is one-dimension Fourier transformed in the phase encode axis direction to obtain complex imaging data f" (n, m).

Thereafter, an image is reconstructed from the complex imaging data f" (n, m).

Figure 4:
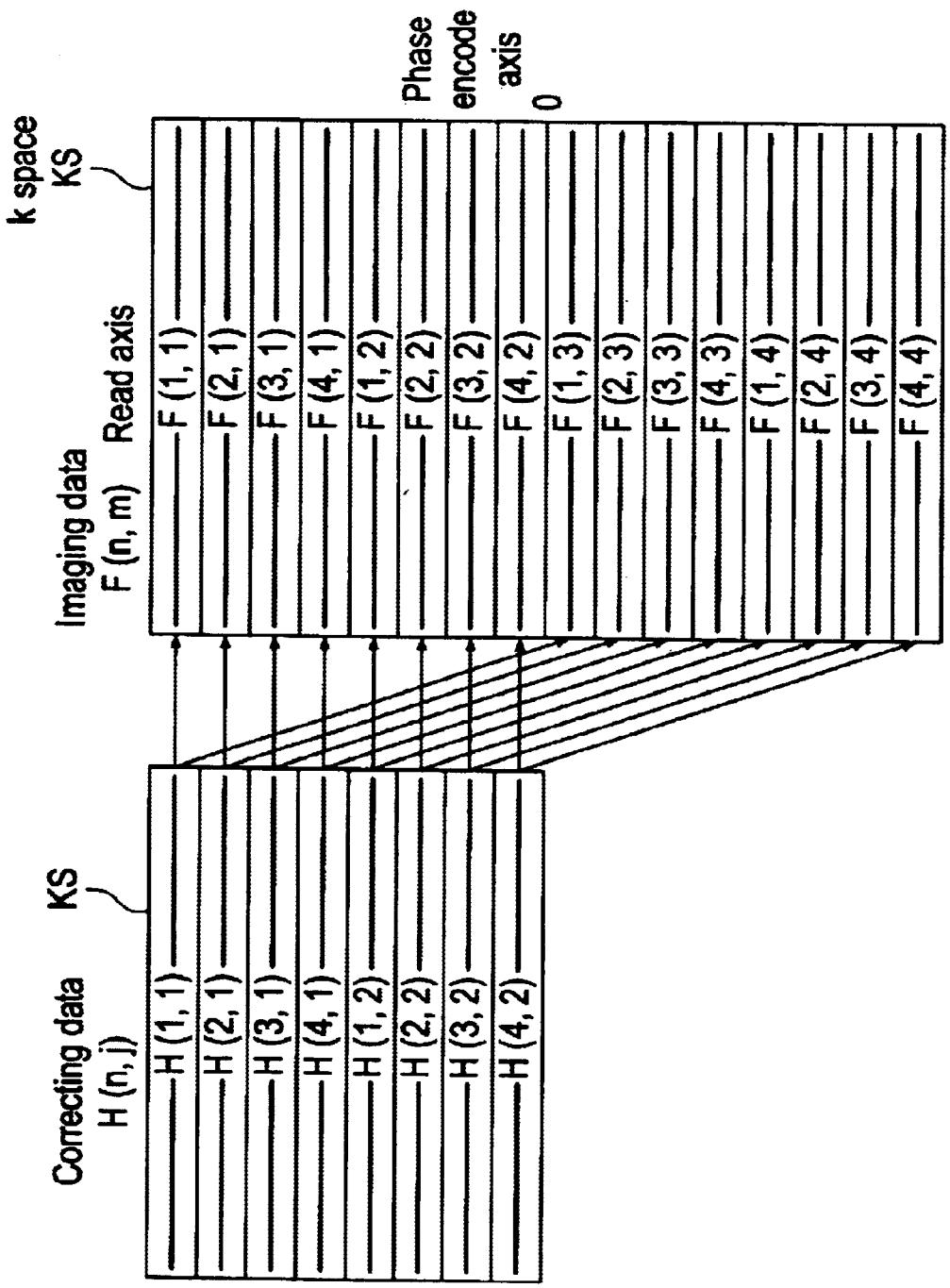
FIG. 4 is a concept view showing correspondence of correcting data with imaging data according to the first embodiment.

FIG. 4 is a concept view showing correspondence of the imaging data F (n, m) with the correcting data H (n, j) for use in the phase correction thereof.

Such a correspondence can match the polarity of a data collecting read gradient rm corresponding to imaging data H (n, m) with the polarity of a data collecting read gradient Nrj corresponding to correcting data H (n, j) for use in the phase correction thereof.

Figure 5:
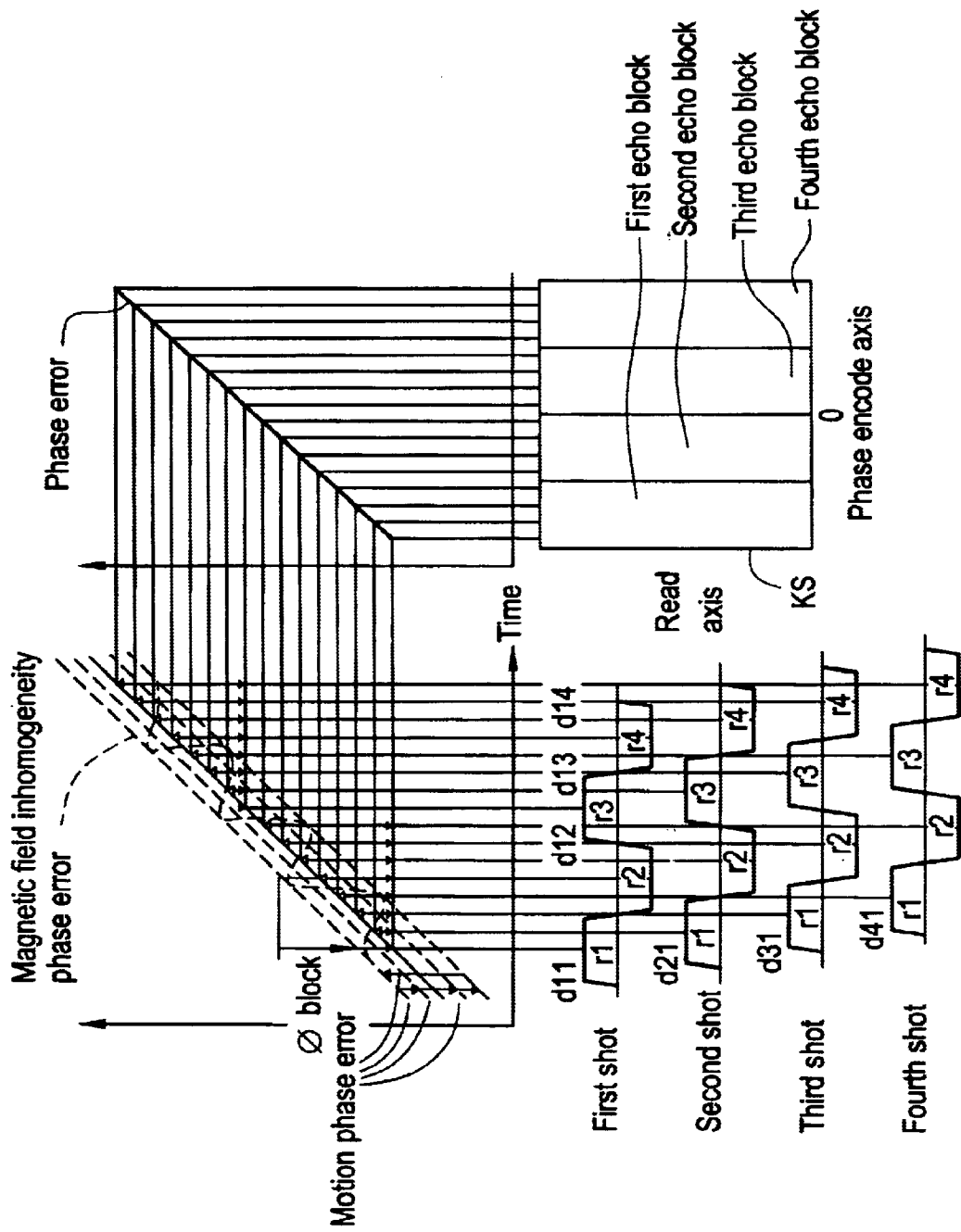
FIG. 5 is an explanatory view of phase error characteristics according to the first embodiment.

FIG. 5 is an explanatory view showing phase errors of the imaging data f" (n, m) after phase correction.

The first term of $\phi 0$ cor (n, m) of (Equation 1) and $\phi 1$ cor (n, m) of (Equation 2) correct the motion phase errors (the black-headed arrows) The second and third terms of $\phi 0$ cor (n, m) of (Equation 1) correct the magnetic field inhomogeneity phase errors (the white-headed arrows). As a result, the phase errors of the imaging data f" (n, m) are all different and are changed linearly to remove ghost artifacts.

SECOND EMBODIMENT

In place of (Equation 1) and (Equation 2), there may be used:

Equation 4

$\phi 0$ cor (n, m)=$\phi 0$ NAV (n, 1)−$\phi$block×(n−1)/N

Equation 5

$\phi 1$ cor (n, m)=$\phi 1$ NAV (n, 1)

Figure 6:
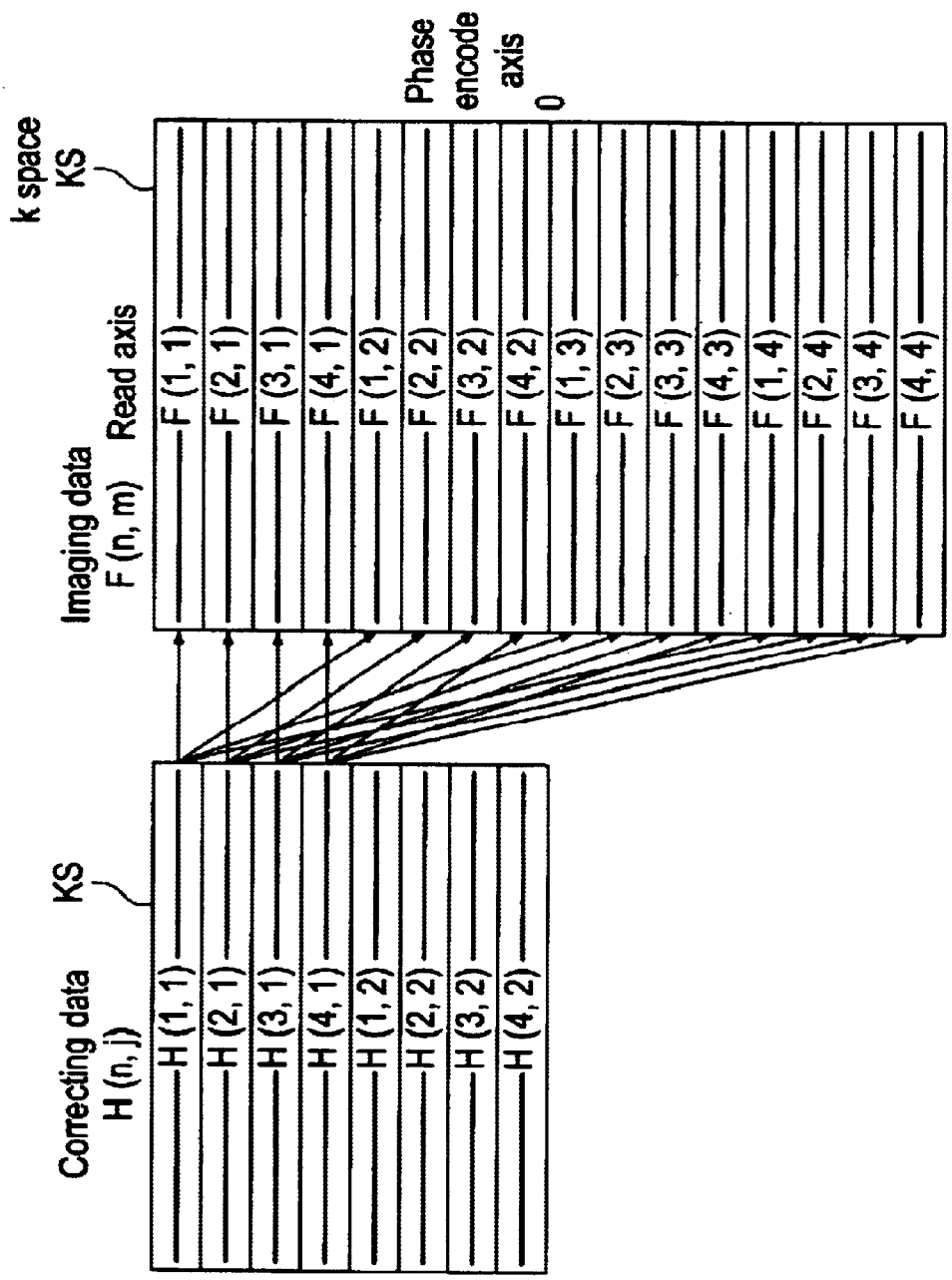
FIG. 6 is a concept view showing correspondence of correcting data with imaging data according to a second embodiment.

FIG. 6 is a concept view showing correspondence of the imaging data F (n, m) with the correcting data H (n, j) for use in the phase correction thereof.

Figure 7:
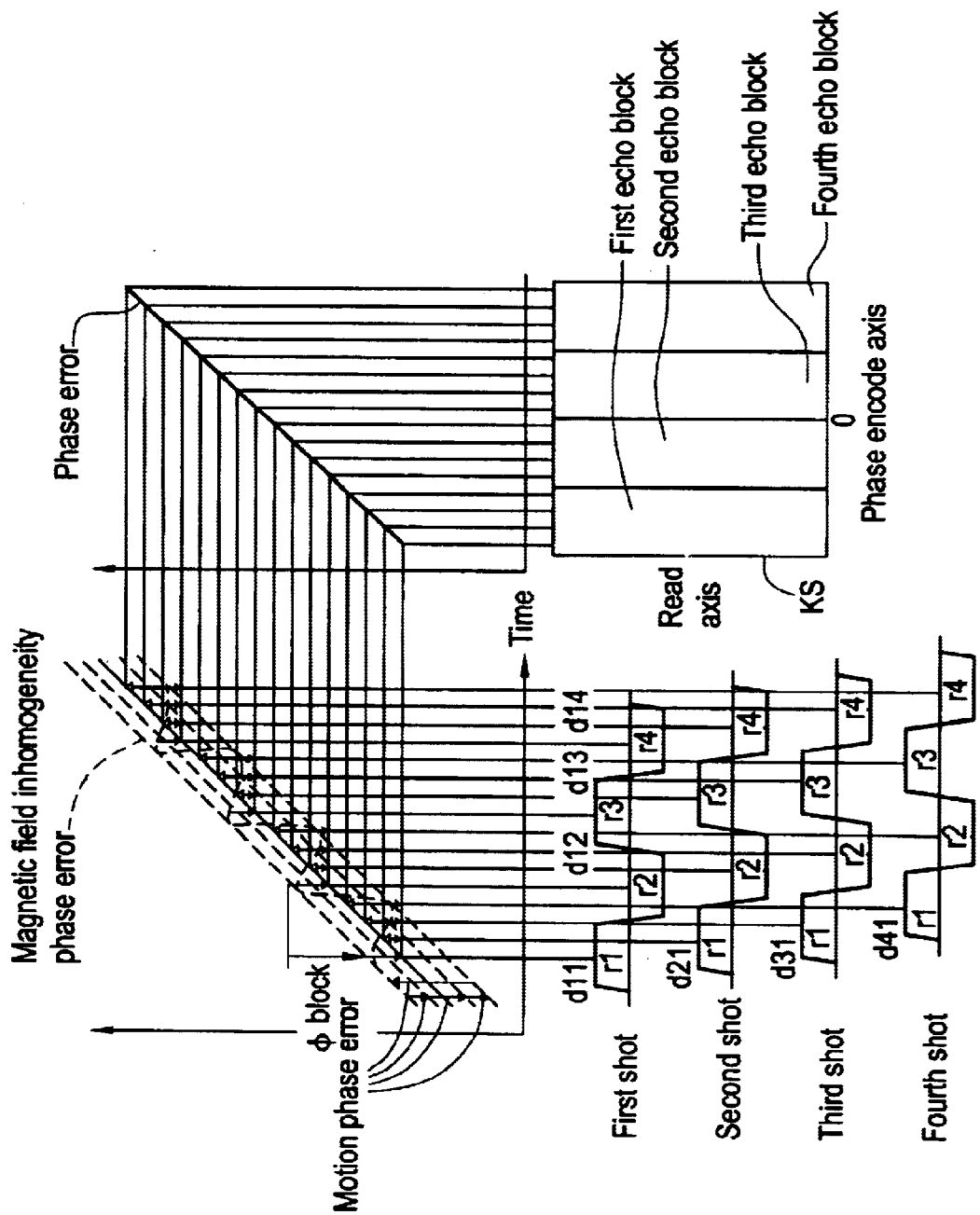
FIG. 7 is an explanatory view of phase error characteristics according to the second embodiment.

FIG. 7 is an explanatory view showing phase errors of the imaging data f" (n, m) after phase correction.

The first term of $\phi 0$ cor (n, m) of (Equation 4) and $\phi 1$ cor (n, m) of (Equation 5) correct the motion phase errors (the black-headed arrows). The second term of $\phi 0$ cor (n, m) of (Equation 4) corrects the magnetic field inhomogeneity phase errors (the white-headed arrows). As a result, the phase errors of the imaging data f" (n, m) are all different and are changed linearly to remove ghost artifacts.

THIRD EMBODIMENT

In place of (Equation 1), there may be used:

Equation 6

$\phi 0$ cor (n, m)=$\phi 0$ NAV (n, (m−1)%2+1)+$\phi$block×2×int {(m−1)/2} where int { } is a function for taking out an integer part (a rounded-off integer function).
(Equation 2) is used as it is.

Figure 8:
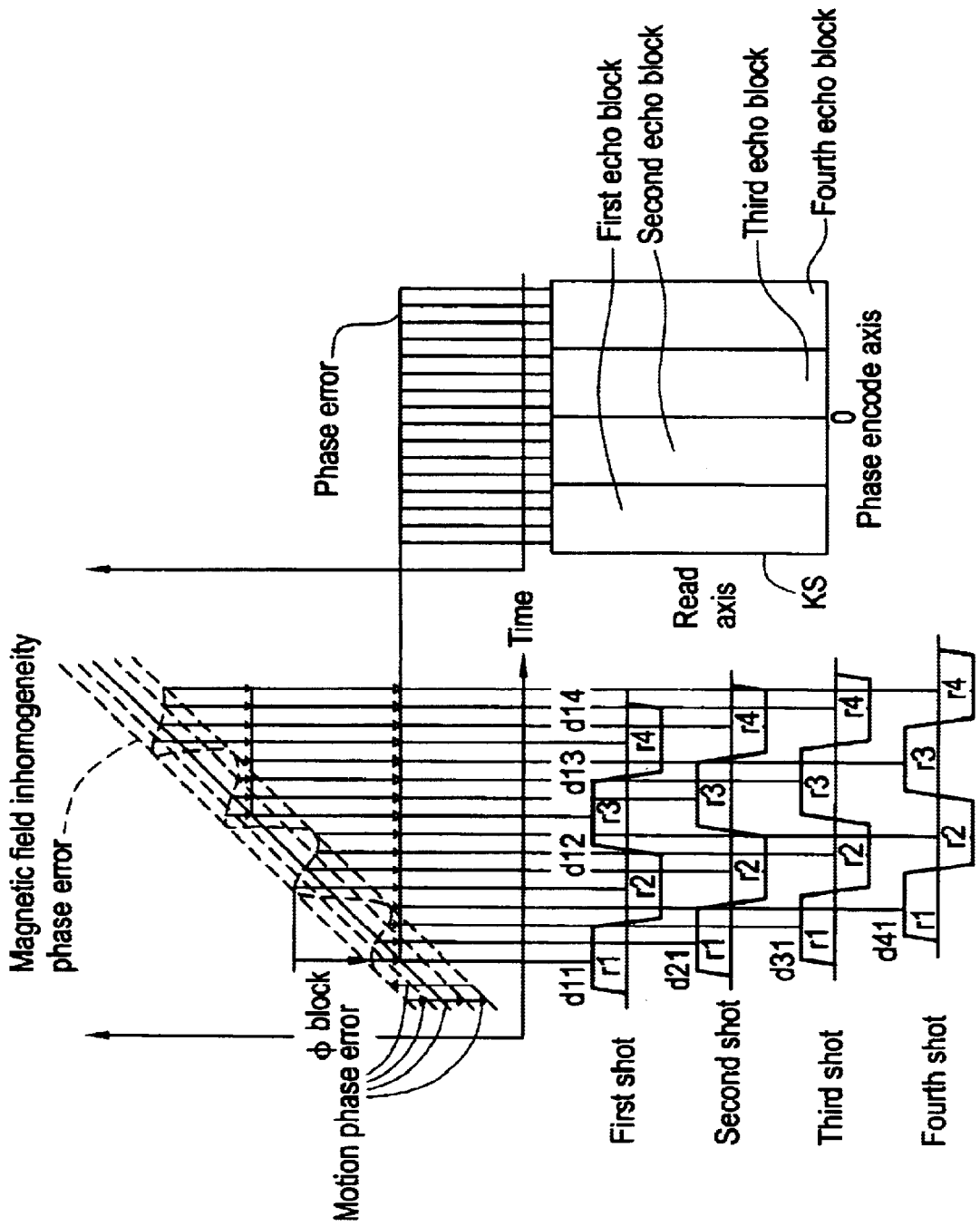
FIG. 8 is an explanatory view of phase error characteristics according to a third embodiment.

FIG. 8 is an explanatory view showing phase errors of the imaging data f" (n, m) after phase correction.

The first term of $\phi 0$ cor (n, m) of (Equation 6) and $\phi 1$ cor (n, m) of (Equation 2) correct the motion phase errors (the black-headed arrows). The second term of $\phi 0$ cor (n, m) of (Equation 6) corrects the magnetic field inhomogeneity phase errors (the white-headed arrows). As a result, the phase errors of the imaging data f" (n, m) are all equal to remove ghost artifacts.

FOURTH EMBODIMENT

In place of (Equation 1) and (Equation 2), there may be used:

Equation 7

$\phi 0$ cor (n, m)=$\phi 0$ NAV (n, 1)+$\phi$block×(m−1)

Equation 8

$\phi 1$ cor (n, m)=$\phi 1$ NAV (n, 1)

Correspondence of the imaging data F (n, m) with the correcting data H (n, j) for use in the phase correction thereof is as shown in FIG. 6.

Figure 9:
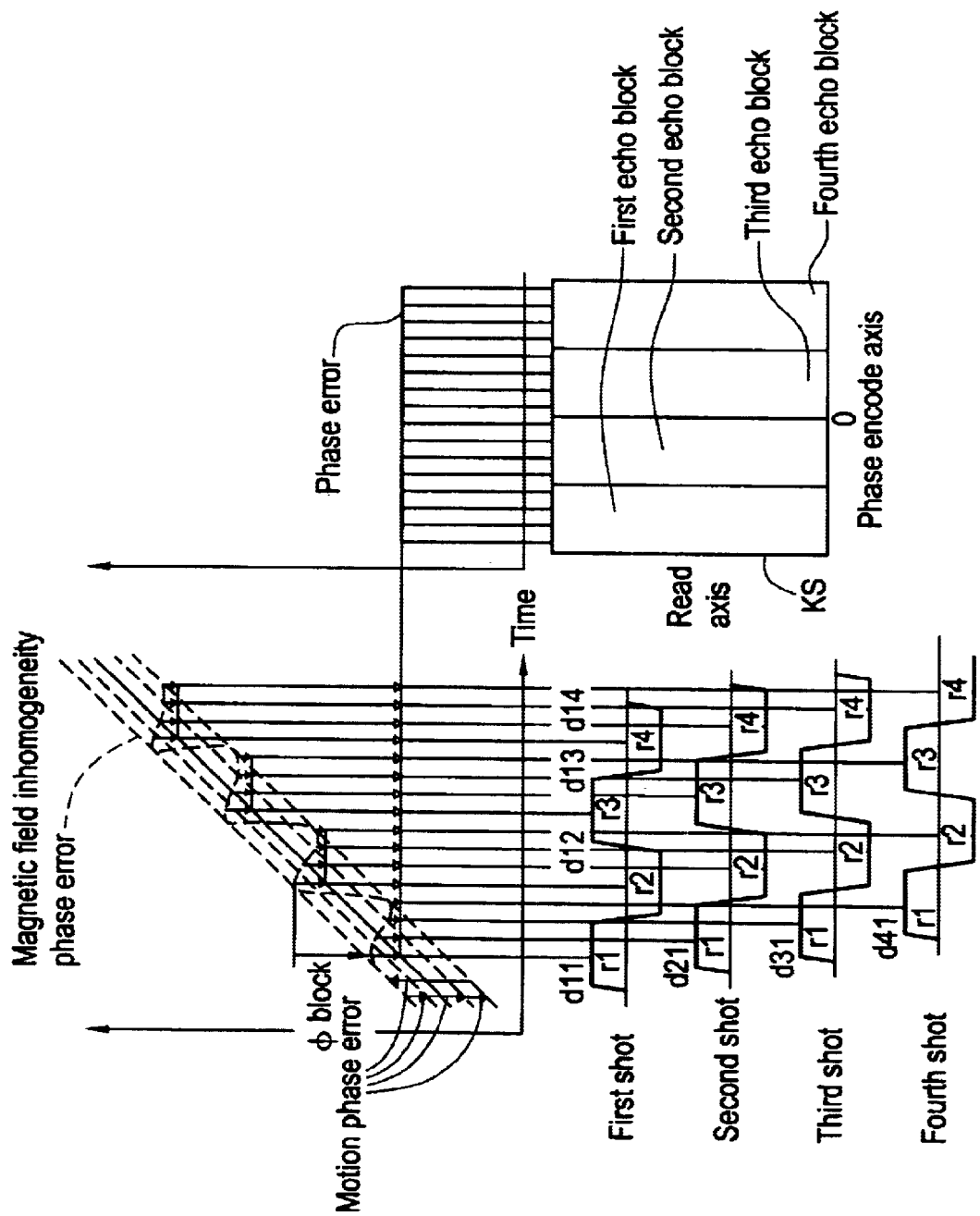
FIG. 9 is an explanatory view of phase error characteristics according to a fourth embodiment.

FIG. 9 is an explanatory view showing phase errors of the imaging data f" (n, m) after phase correction.

The first term of φ0 cor (n, m) of (Equation 7) and φ1 cor (n, m) of (Equation 2) correct the motion phase errors (the black-headed arrows). The second term of φ0 cor (n, m) of (Equation 7) corrects the magnetic field inhomogeneity phase errors (the white-headed arrows). As a result, the phase errors of the imaging data f" (n, m) are all equal to remove ghost artifacts.

FIFTH EMBODIMENT

In place of (Equation 1) and (Equation 2), there may be used:

Equation 9

$$\phi 0 \text{ cor } (n, m) = \phi 0 \text{ NAV } (n, (m-1)\%2+1)$$

Equation 10

$$\phi 1 \text{ cor } (n, m) = \phi 1 \text{ NAV } (n, (m-1)\%2+1)$$

Correspondence of the imaging data F (n, m) with the correcting data H (n, j) for use in the phase correction thereof is as shown in FIG. 4.

Figure 10:
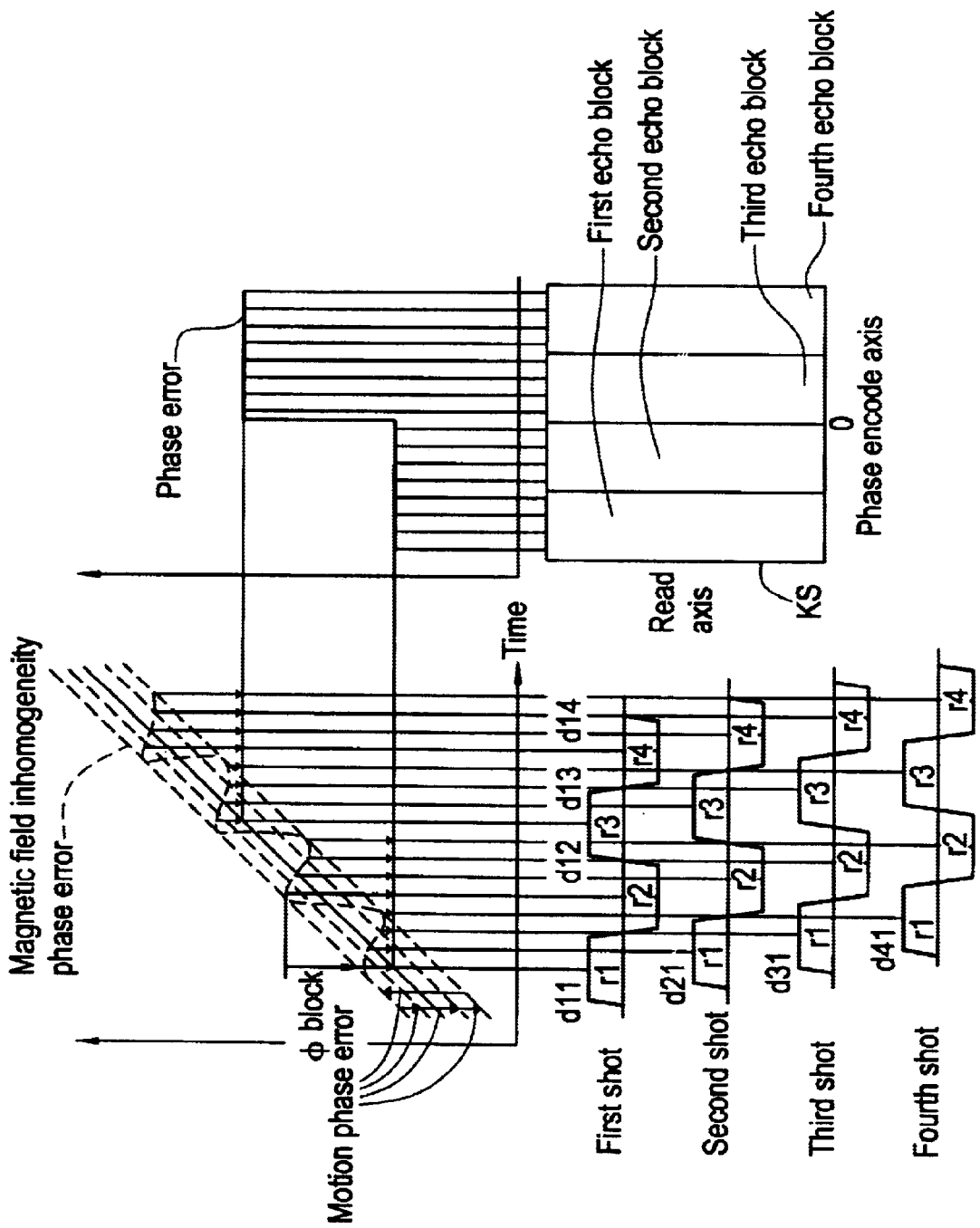
FIG. 10 is an explanatory view of phase error characteristics according to a fifth embodiment.

FIG. 10 is an explanatory view showing phase errors of the imaging data f" (n, m) after phase correction.

Two navigation echoes are successively matched with imaging echoes for phase correction. With the same number of echo blocks as "two" navigation echoes as a unit, a difference can be eliminated. In other words, a phase difference between the first echo block and the second echo block can be eliminated. In addition, a phase difference between the third echo block and the fourth echo block can be eliminated.

SIXTH EMBODIMENT

In place of (Equation 1) and (Equation 2), there may be used:

Equation 11

$$\phi 0 \text{ cor } (n, m) = \phi 0 \text{ NAV } (n, 1)$$

Equation 12

$$\phi 1 \text{ cor } (n, m) = \phi 1 \text{ NAV } (n, 1)$$

Correspondence of the imaging data F (n, m) and the correcting data H (n, j) for use in the phase correction thereof is as shown in FIG. 6.

Figure 23:
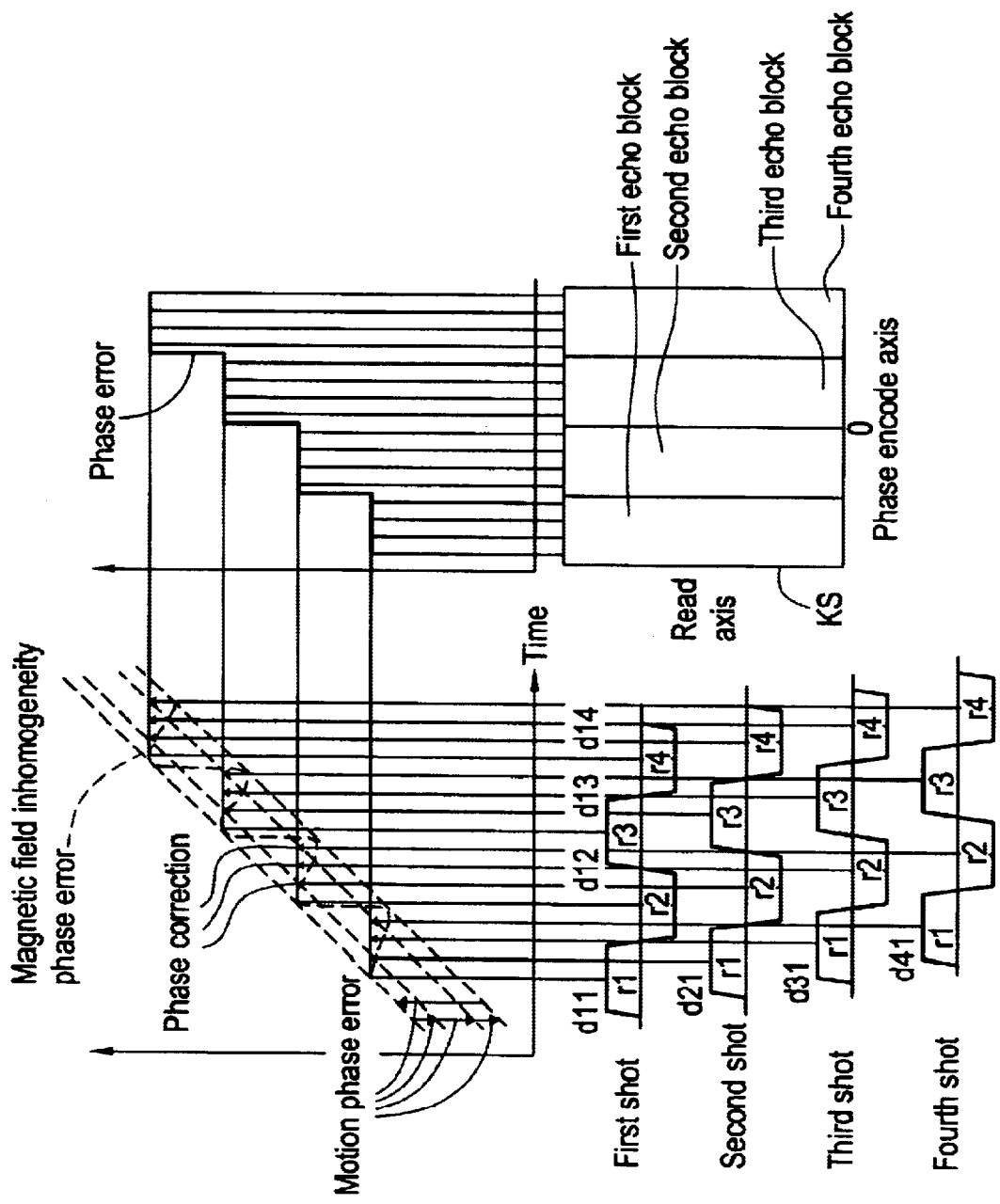
FIG. 23 is an explanatory view of phase error characteristics of the imaging data phase corrected by the correcting data collected by the pulse sequence of FIG. 22.

Phase errors of the imaging data f" (n, m) after phase correction are as shown in FIG. 23.

Figure 11:
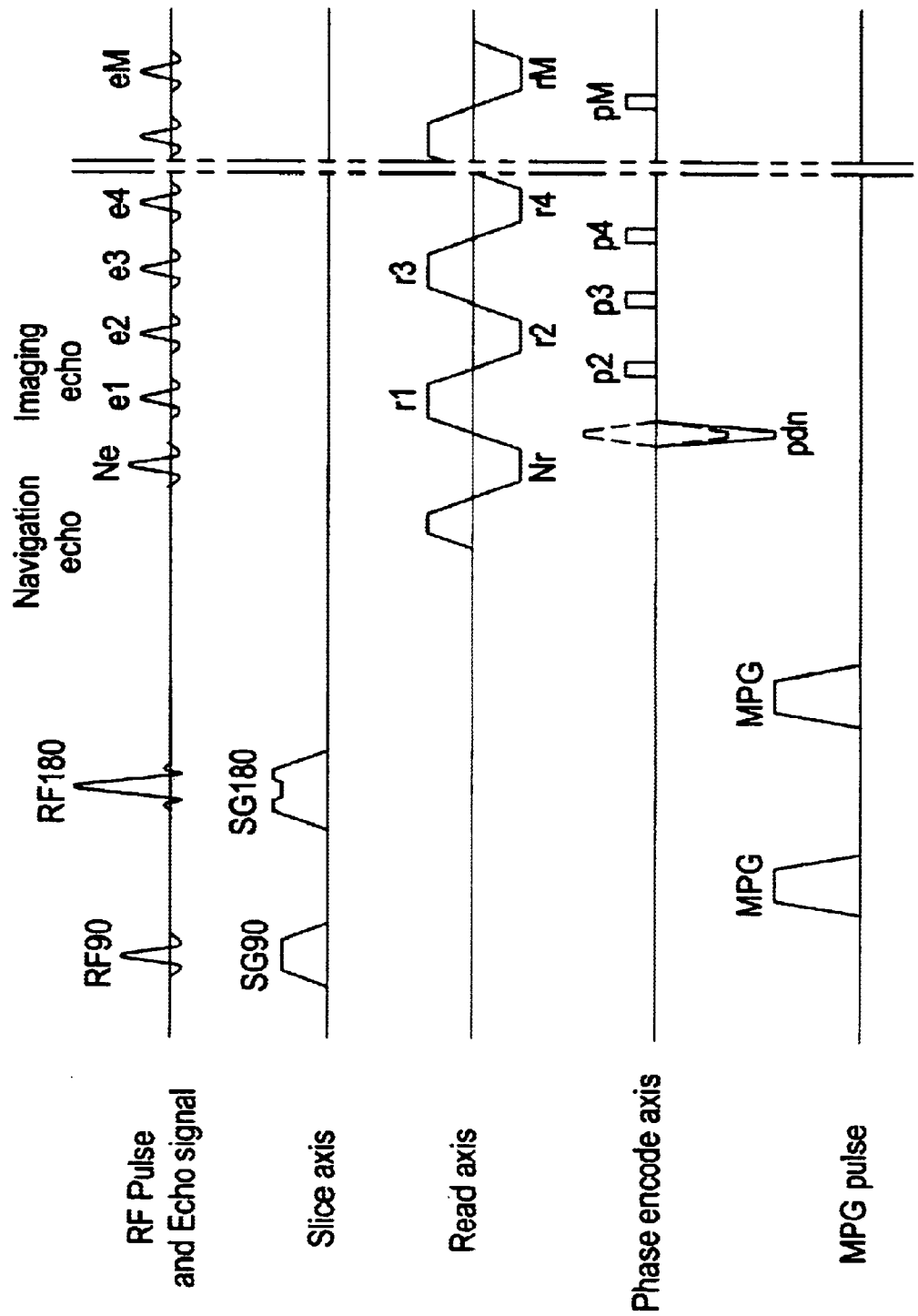
FIG. 11 is a pulse sequence diagram of the multishot diffusion enhancement EPI method usable in a sixth embodiment.

In a sixth embodiment, since only the correcting data H (n, 1) is used, the pulse sequence of FIG. 11 may be used in place of the pulse sequence of FIG. 2. In other words, the data collecting read gradient Nr may be applied, and be sampled by being timed to focus the navigation echo Ne so as to collect correcting data H (n, 1) corresponding to the navigation echoes Ne.

SEVENTH EMBODIMENT

Figure 12:
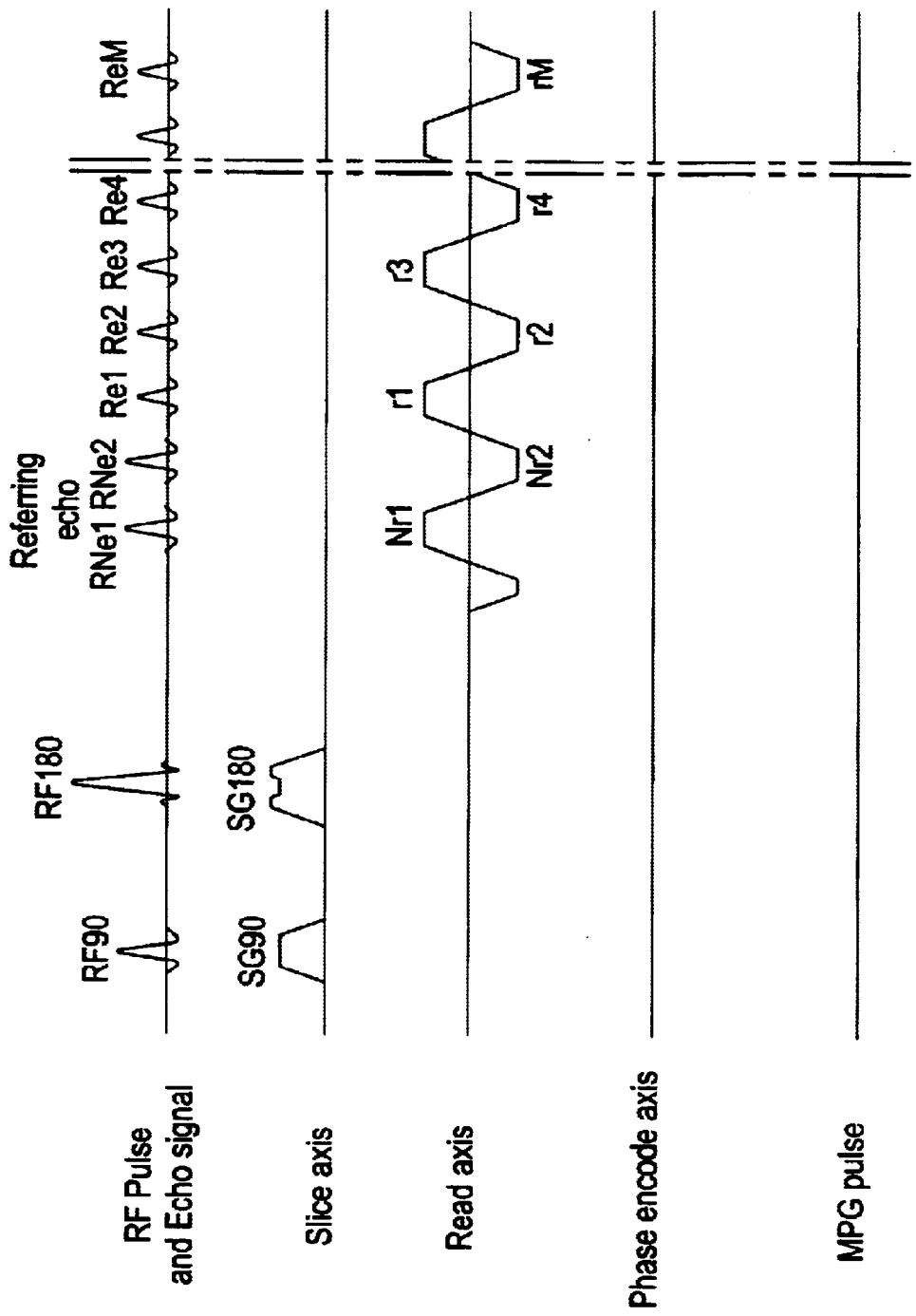
FIG. 12 is a pulse sequence diagram of a referring pulse sequence according to a seventh embodiment.

FIG. 12 is a pulse sequence diagram showing a referring pulse sequence according to a seventh embodiment of the present invention.

The referring pulse sequence omits the phase encode gradient and the MPG pulse from the pulse sequence of FIG. 2. Referring data RH (j) is collected from the focused referring echoes RNe1, ..., RNeJ (J≧1. J=2 in FIG. 12), and sequentially, referring data RF (m) is collected from the focused referring echoes Re1, ..., ReM. This is executed only once.

Figure 13:
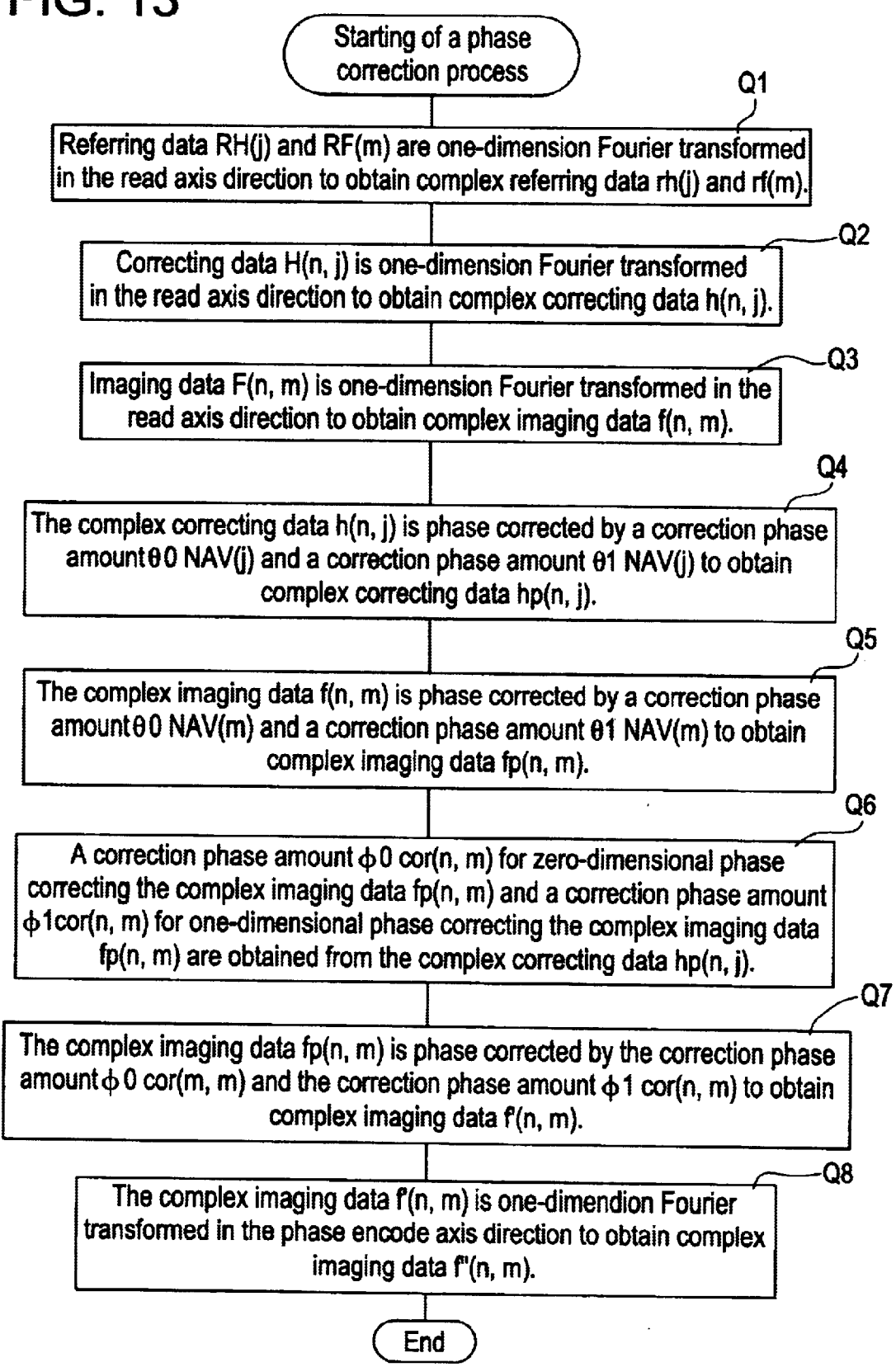
FIG. 13 is flowchart showing a phase correction process according to the seventh embodiment.

FIG. 13 is a flowchart showing a phase correction process according to the seventh embodiment.

In step Q1, the referring data RH (j) is one-dimension Fourier transformed in the read axis direction to obtain complex referring data rh (j). In addition, the referring data RF (m) is one-dimension Fourier transformed in the read axis direction to obtain complex referring data rf (m).

In step Q2, the correcting data H (n, j) is one-dimension Fourier transformed in the read axis direction to obtain complex correcting data h (n, j).

In step Q3, the imaging data F (n, m) is one-dimension Fourier transformed in the read axis direction to obtain complex imaging data f (n, m).

In step Q4, the complex correcting data h (n, j) is zero- and one-dimensional phase corrected to obtain complex correcting data hp (n, Specifically, when θ0 NAV (j) is a zero-dimensional phase determined from the complex referring data rh (j), θ1 NAV (j) is a one-dimensional phase determined from the complex referring data rh (j), and considering index l (l=1 to L) of a sampling point of the correcting data h (n, j), correcting data h (l, n, j) is phase corrected to obtain complex correcting data hp (l, n, j) as follows:

Equation 13

$$hp (l, n, j) = h (l, n, j) \times \exp \{-j (\theta 0 \text{ NAV } (j) + \theta 1 \text{ NAV } (j) \times l)\}$$

In step Q5, the complex imaging data f (n, m) is zero- and one-dimensional phase corrected to obtain complex imaging data fp (n, m).

Specifically, when θ0 NAV (m) is a zero-dimensional phase determined from the complex referring data rf (m), θ1 NAV (m) is a one-dimensional phase determined from the complex referring data rf (m), and considering index l (l=1 to L) of a sampling point of the complex imaging data f (n, m), complex imaging data f (l, n, m) is phase corrected to obtain complex imaging data fp (l, n, m) as follows:

Equation 14

$$fp (l, n, m) = f(l, n, m) \times \exp \{-j (\theta 0 \text{ NAV } (m) + \theta 1 \text{ NAV } (m) \times l)\}$$

Figure 14:
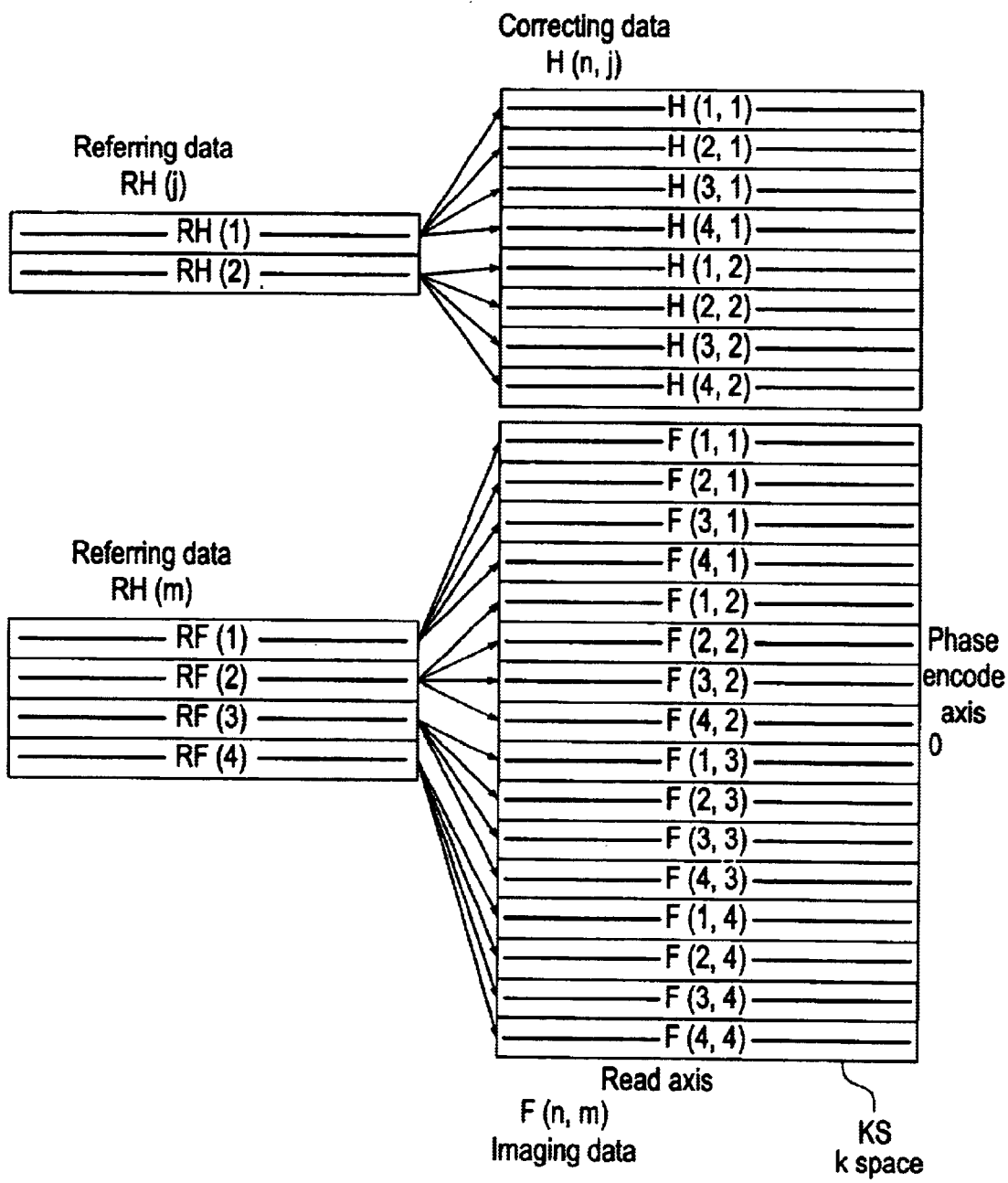
FIG. 14 is a concept view showing correspondence of referring data with correcting data or imaging data according to the seventh embodiment.

FIG. 14 is a concept view showing correspondence of the correcting data H (n, j) or the imaging data F (n, m) with the referring data RH (n, j) or the RF (n, m) for use in the phase correction thereof.

Both correspond with each other by echo numbers j and m.

Figure 15:
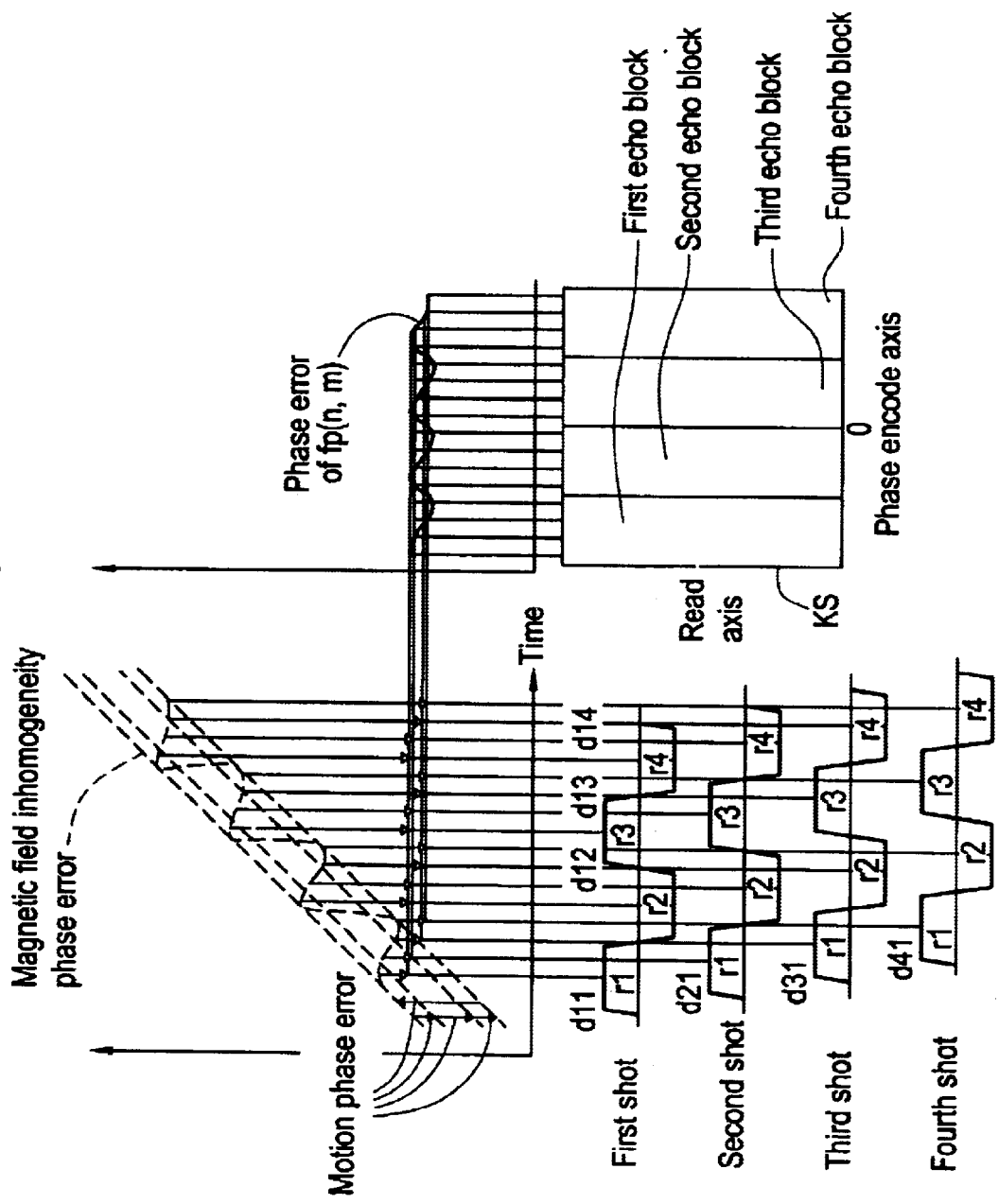
FIG. 15 is an explanatory view of phase error characteristics of the imaging data corrected by the referring data.

FIG. 15 is a concept view showing phase errors of the imaging data fp (n, m) after phase corrected by the referring data RF (n, m).

Since they correspond with each other by the echo number m for phase correction, the magnetic field inhomogeneity phase errors are corrected, but the motion phase errors remain.

In step Q6, a correction phase amount φ0 cor (n, m) for zero-dimensional phase correcting the complex imaging data fp (n, m) and a correction phase amount $\phi$1 cor (n, m) for one-dimensional phase correcting the complex imaging data fp (n, m) are obtained from the complex correcting data hp (n, j). Specifically, Equation 15

$$\phi0 \text{ cor } (n, m) = \phi0 \text{ NAV } (n, (m-1)\%2+1)$$

Equation 16

$$\phi1 \text{ cor } (n, m) = \phi1 \text{ NAV } (n, (m-1)\%2+1)$$

In step Q7, the complex imaging data fp (n, m) is phase corrected using the $\phi$0 cor (n, m) and $\phi$1 cor (n, m) to obtain complex imaging data f' (n, m).

Specifically, considering index l (l=1 to L) of a sampling point of the complex imaging data fp (n, m), complex imaging data fp (l, n, m) is phase corrected to obtain complex imaging data f' (l, n, m) as follows:

Equation 17

$$f'(l, n, m) = fp(l, n, m) \times \exp\{-j(\phi0 \text{ cor }(n, m) + \phi1 \text{ cor }(n, m) \times l)\}$$

In step Q8, the complex imaging data f' (n, m) is one-dimension Fourier transformed in the phase encode axis direction to obtain complex imaging data f" (n, m).

Thereafter, an image is reconstructed from the complex imaging data f" (n, m).

Correspondence of the imaging data F (n, m) with the correcting data H (n, j) for use in the phase correction thereof is as shown in FIG. 4.

Figure 16:
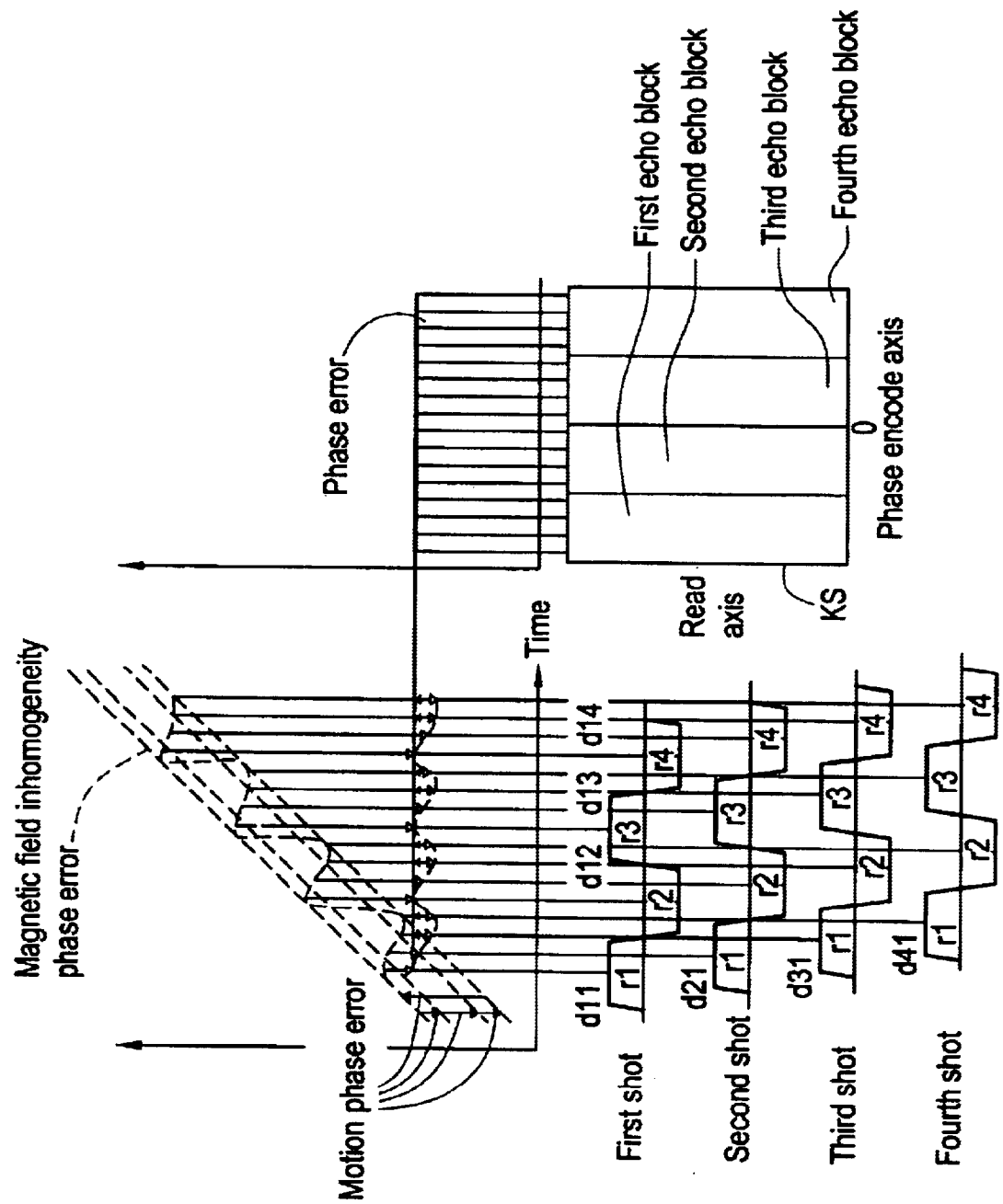
FIG. 16 is an explanatory view of phase error characteristics according to the seventh embodiment.

FIG. 16 is an explanatory view showing phase errors of the imaging data f" (n, m) after phase correction.

$\phi$0 cor (n, m) of (Equation 15) and $\phi$1 cor (n, m) of (Equation 16) correct the motion phase errors (the black-headed arrows).

As a result, the phase errors of the imaging data f" (n, m) are all equal to remove ghost artifacts.

In addition, since the referring data corrects the correcting data and the imaging data, phase errors by other causes other than the magnetic field inhomogeneity and motion (the system itself and shifting of the echo center), thereby making it possible to improve the quality.

EIGHTH EMBODIMENT

In place of (Equation 15) and (Equation 16), there may be used:

Equation 18

$$\phi0 \text{ cor } (n, m) = \phi0 \text{ NAV } (n, 1)$$

Equation 19

$$\phi1 \text{ cor } (n, m) = \phi1 \text{ NAV } (n, 1)$$

Correspondence of the imaging data F (n, m) with the correcting data H (n, j) for use in the phase correction thereof is as shown in FIG. 6.

Phase errors are as shown in FIG. 16.

Figure 17:
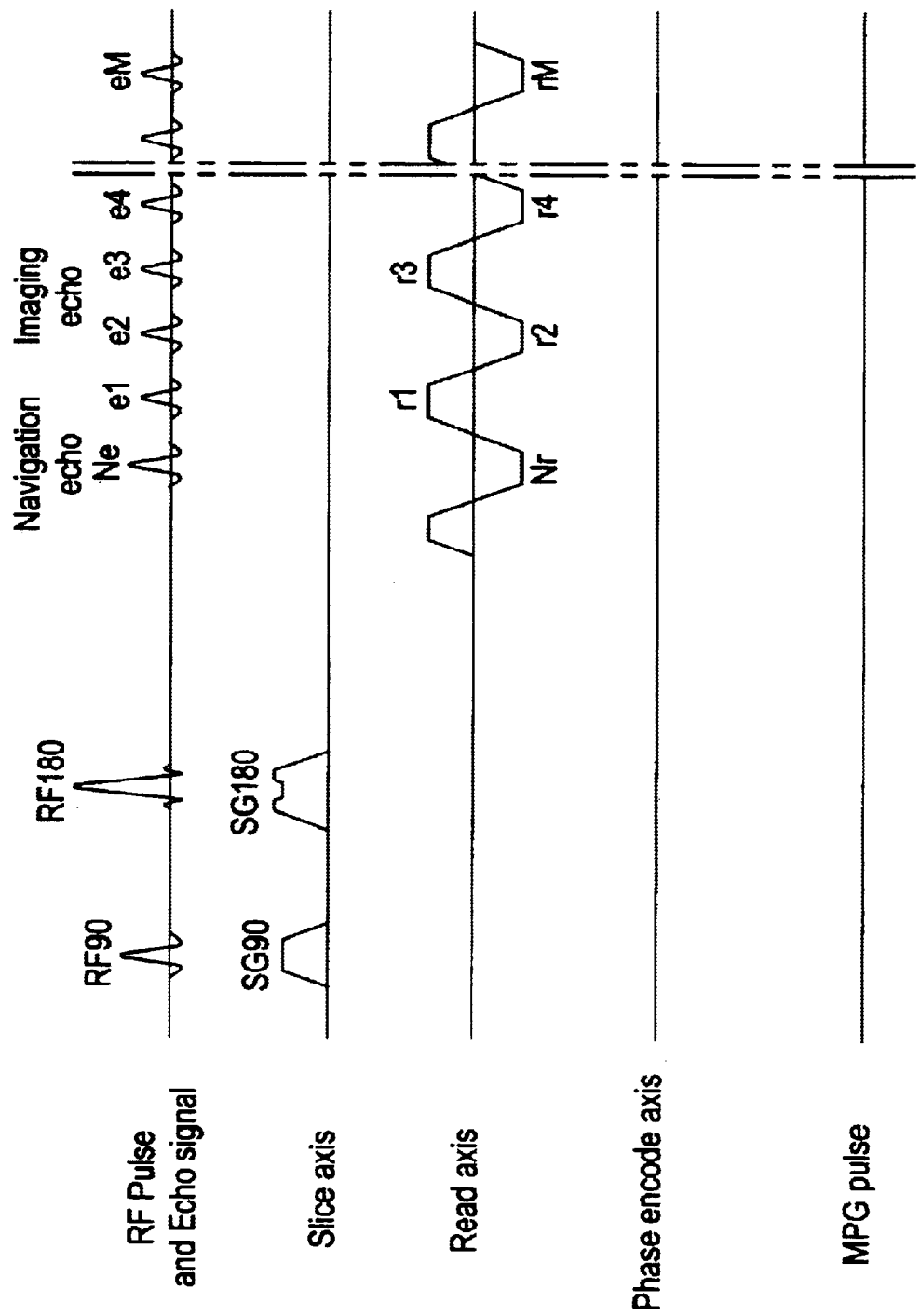
FIG. 17 is a pulse sequence diagram of a referring pulse sequence usable in the seventh embodiment.
Figure 18:
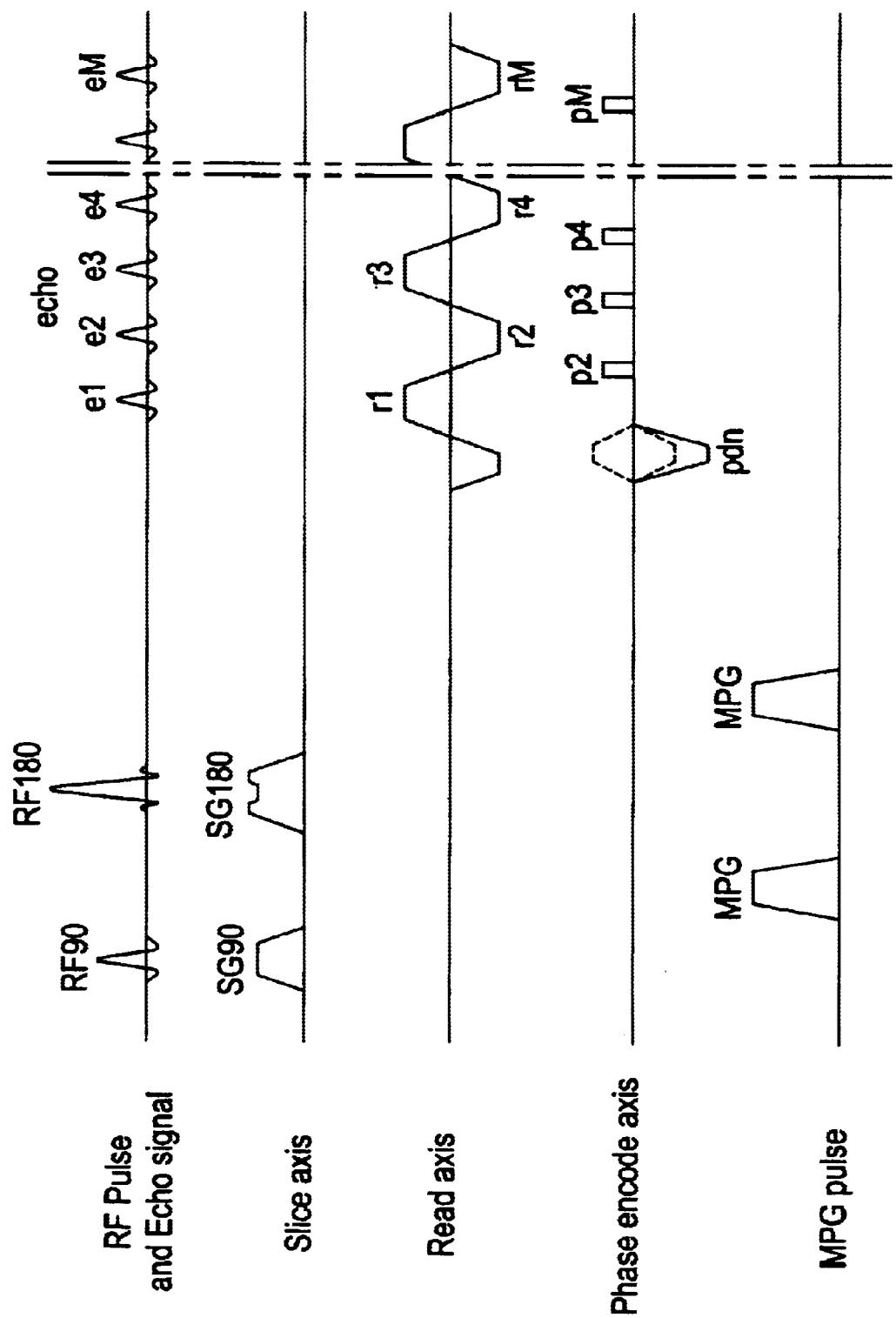
FIG. 18 is a pulse sequence diagram showing a basic example of the pulse sequence of the multishot diffusion enhancement EPI method.
Figure 19:
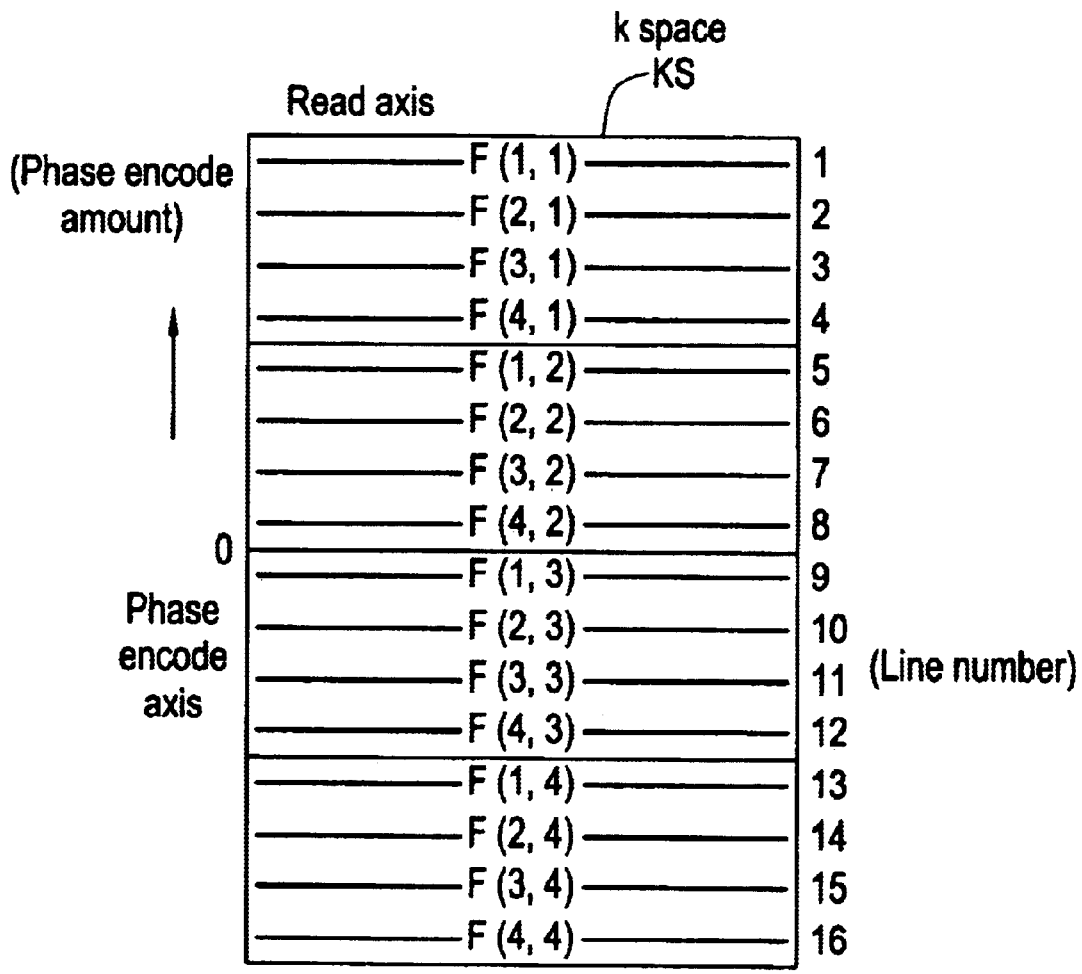
FIG. 19 is an explanatory view of data collecting trajectories of a k space by the pulse sequence of the multishot diffusion enhancement EPI method.
Figure 20:
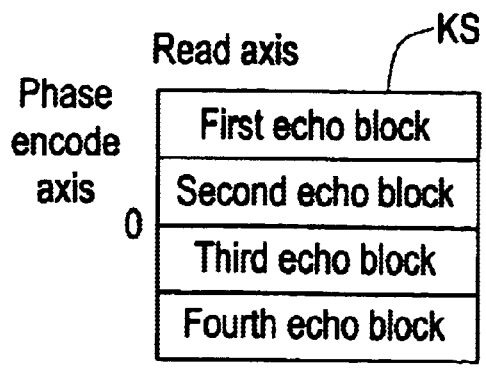
FIG. 20 is an explanatory view of echo blocks of the k space by the pulse sequence of the multishot diffusion enhancement EPI method.
Figure 21:
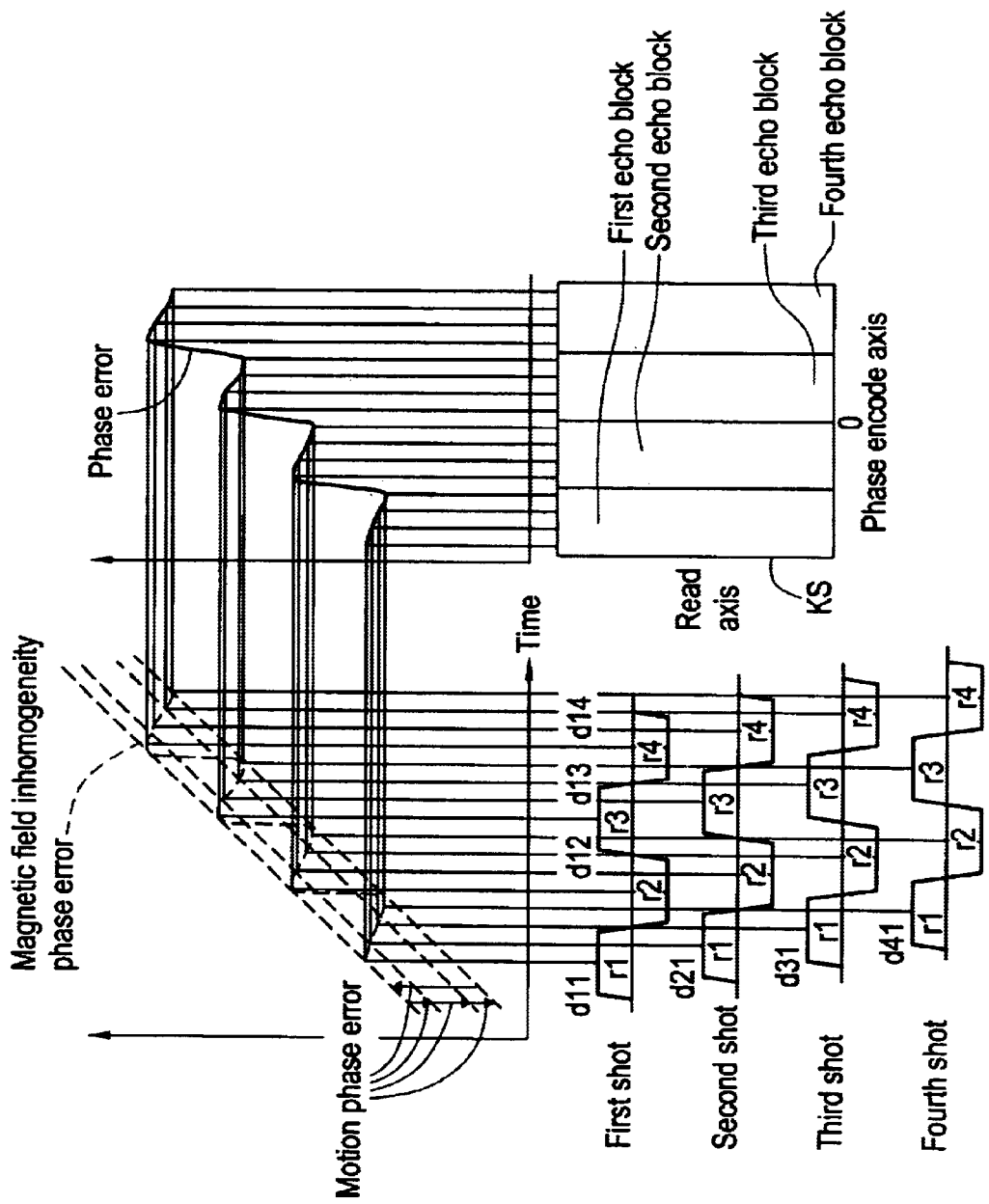
FIG. 21 is an explanatory view of phase error characteristics of the imaging data collected by the pulse sequence of FIG. 18.
Figure 22:
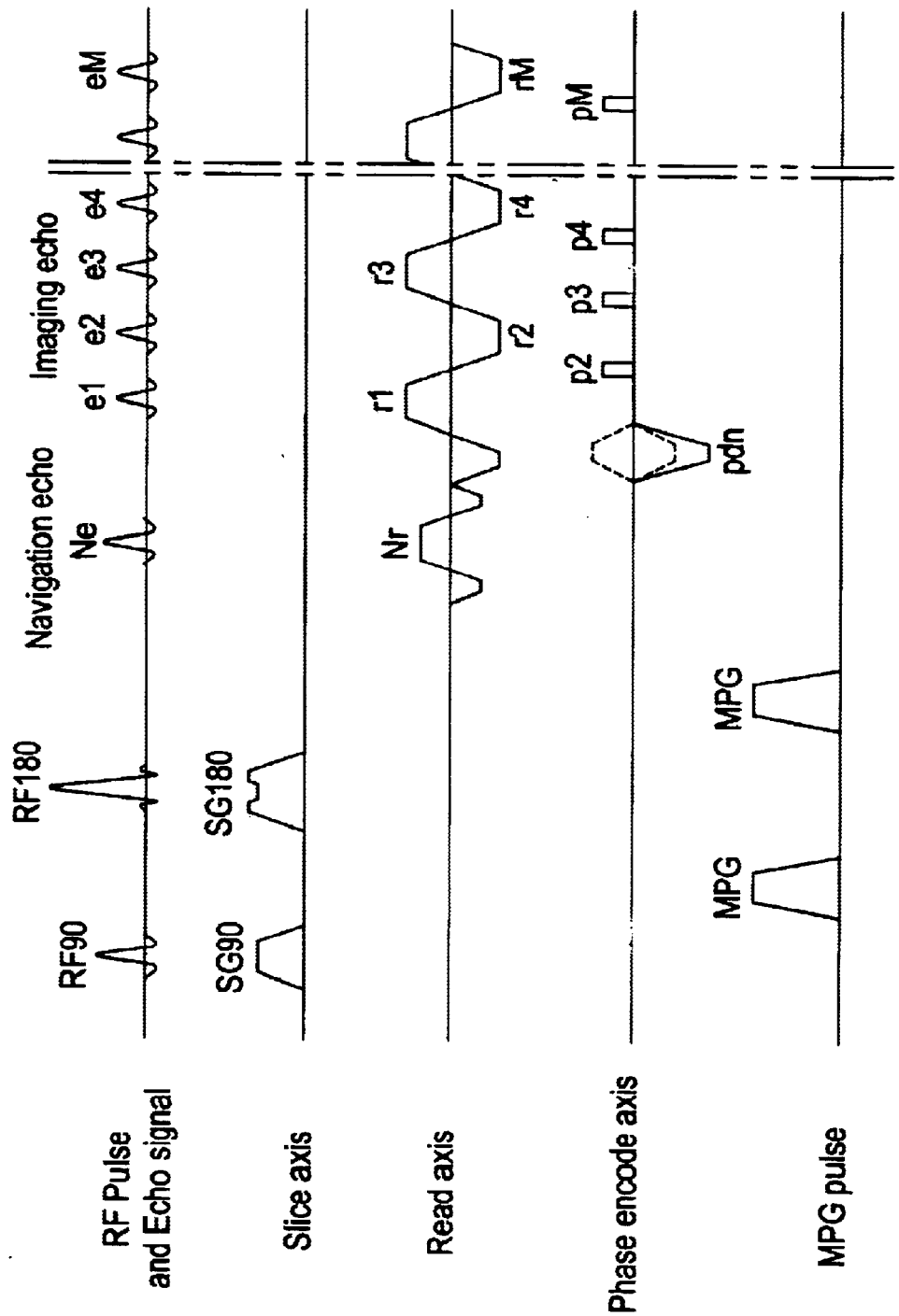
FIG. 22 is a pulse sequence diagram showing a pulse sequence in which a navigation echo is added to the basic example of the pulse sequence of the multishot diffusion enhancement EPI method.

In an eighth embodiment, only the correcting data H (n, 1) is used. The pulse sequence of FIG. 11 may be used in place of the pulse sequence of FIG. 2. The pulse sequence of FIG. 17 may be used in place of the pulse sequence of FIG. 12. In other words, only one navigation echo Ne may be used as the navigation echo.

Many widely different embodiments of the invention may be configured without departing from the spirit and the scope of the present invention. It should be understood that the present invention is not limited to the specific embodiments described in the specification, except as defined in the appended claims.

What is claimed is:

1. A phase correction method comprising:
repeating by N shots a pulse sequence in which when a k space is divided from a first line to an N×Mth line in the phase encode axis direction, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse;
collecting diffusion enhancement imaging data for filling the k-space from the imaging echoes;
collecting correcting data from the navigation echo; and
phase correcting the imaging data based on the correcting data, wherein the phase correcting includes smoothly changing phase errors of the imaging data in a phase encode axis direction from the first line to the N×Mth line.

2. The phase correction method of claim 1, wherein two or more navigation echoes are provided to one shot, and the polarity of the data collecting read gradient corresponding to imaging data is matched with the polarity of the data collecting read gradient corresponding to correcting data for use in phase correction of the imaging data.

3. The phase correction method of claim 1, wherein two or more navigation echoes are provided to one shot, a correction amount of a motion phase error is determined from the phase of the navigation echo of the shots, and a correction amount of a magnetic field inhomogeneity phase error is determined from a phase difference between the shots.

4. The phase correction method of claim 3, wherein the imaging data is phase corrected so that the phase errors of the imaging data are smoothly changed in the phase encode axis direction from the first line to the N×Mth line.

5. A phase correction method in accordance with claim 3 wherein the phase difference is a phase difference between two successive navigation echoes.

6. A phase correction method in accordance with claim 3 wherein the correction amount of the magnetic field inhomogeneity phase error is determined to be a maximum value of phase differences between the navigation echoes.

7. A phase correction method in accordance with claim 3 wherein the correction amount of the magnetic field inhomogeneity phase error is determined to be an average of phase differences between the navigation echoes.

8. The phase correction method of claim 1, wherein the imaging data is phase corrected so that phase errors of the imaging data are the same in the phase encode axis direction from the first line to the N×Mth line.

9. The phase correction method of claim 1, wherein one navigation echo is provided to one shot, and a correction amount of a motion phase error is determined from the phase of the navigation echo of the shots.

10. A phase correction method comprising:
repeating by N shots a pulse sequence in which when a k space is divided from a first line to an N×Mth line in the phase encode axis direction, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse;

collecting diffusion enhancement imaging data for filling the k space from the imaging echo;

collecting correcting data from the navigation echo;

collecting referring data corresponding to the imaging data and correcting data from a referring echo focused by executing a referring pulse sequence omitting the phase encode gradient and MPG pulse from the pulse sequence;

phase correcting the imaging data based on the corresponding referring data;

phase correcting the correcting data based on the corresponding referring data; and phase correcting imaging data phase-corrected by the referring data based on correcting data phase-corrected by the referring data.

11. The phase correction method of claim 9, wherein two or more navigation echoes are provided to one shot, and the polarity of the data collecting read gradient corresponding to imaging data is matched with the polarity of the data collecting read gradient corresponding to correcting data for use in phase correction of the imaging data.

12. The phase correction method of claim 10, wherein the imaging data is phase corrected so that the phase errors of the imaging data are the same in the phase encode axis direction from the first line to the N×Mth line.

13. The phase correction method of claim 10, wherein one navigation echo is provided to one shot, and a correction amount of a motion phase error is determined from the phase of the navigation echo of the shots.

14. An MRI system comprising:

an RE pulse transmitting device;

a gradient pulse application device;

an NMR signal receiving device;

a data collection control device for controlling the RE pulse-transmitting device, the gradient pulse application device, and the NMR signal receiving device, repeating by N shots a pulse sequence in which when a k space is divided in the phase encode axis direction from a first line to an N×Mth line, data collecting read gradients are applied while inverting so as to focus M-piece imaging echoes per inverting RE pulse and to focus one or more navigation echoes as an echo train continuous to the M-piece imaging echoes before the M-piece imaging echoes and an MPG pulse is applied before and after the inverting pulse, collecting diffusion enhancement imaging data for filling the k space from the imaging echo, and collecting correcting data from the navigation echo;

a correction arithmetic operation device for phase correcting the imaging data based on the correcting data, wherein the correction arithmetic operation device phase corrects the imaging data to smoothly change phase errors of the imaging data in a phase encode axis direction from the first line to the N×Mth line; and a reconstruction arithmetic operating device for reconstructing an image from the imaging data after correction arithmetic operation.

15. The MRI system of claim 14, wherein the data collection control device provides two or more navigation echoes to one shot, and the correction arithmetic operation device matches the polarity of the data collecting read gradient corresponding to imaging data with the polarity of the data collecting read gradient corresponding to correcting data for use in phase correction of the imaging data.

16. The MRI system of claim 14, wherein the data collection control device provides two or more navigation echoes to one shot, and the correction arithmetic operation device determines a correction amount of a motion phase error from the phase of the navigation echo of the shots and determines a correction amount of a magnetic field inhomogeneity phase error from a phase difference between the navigation echoes of the shots.

17. The MRI system of claim 16, wherein the correction arithmetic operation device phase corrects the imaging data so that the phase errors of the imaging data are smoothly changed in the phase encode axis direction from the first line to the N×Mth line.

18. MRI system in accordance with claim 16 wherein the phase difference is a phase difference between two successive navigation echoes.

19. An MRI system in accordance with claim 16 wherein the correction amount of the magnetic field inhomogeneity phase error is determined to be a maximum value of phase differences between the navigation echoes.

20. MRI system in accordance with claim wherein the correction amount of the magnetic field inhomogeneity phase error is determined to be an average of phase differences between the navigation echoes.

21. The MRI system of claim 14, wherein the correction arithmetic operation device phase corrects the imaging data so that the phase errors of the imaging data are the same in the phase encode axis direction from the first line to the N×Mth line.

22. The MRI system of claim 14, wherein the data collection control device provides one navigation echo to one shot, and the correction arithmetic operation device determines a correction amount of a motion phase error from the phase of the navigation echo of the shots.

23. An MRI system comprising:

an RF pulse transmitting device;

a gradient pulse application device;

an NMR signal receiving device;

a data collection control device for controlling the RF pulse transmitting device, the gradient pulse application device, and the NMR signal receiving device, the data collection control device repeating by N shots a pulse sequence in which when a k space is divided in the phase encode axis direction from the first line to the N×Mth line, data collecting read gradients are applied while inverting so as to focus M-piece imaging echoes per inverting RF pulse and to focus one or more navigation echoes as an echo train continuous to the M-piece imaging echoes before the M-piece imaging echoes and an MPG pulse is applied before and after the inverting pulse, collecting diffusion enhancement imaging data for filling the k space from the imaging echo, collecting correcting data from the navigation echo, and collecting referring data corresponding to the imaging data and correcting data from a referring echo focused by executing a referring pulse sequence omitting the phase encode gradient and MPG pulse from the pulse sequence;

a correction arithmetic operation device for phase correcting the imaging data based on the corresponding referring data, phase correcting the correcting data based on the corresponding referring data, and phase correcting imaging data phase-corrected by the referring data based on correcting data phase-corrected by the referring data; and a reconstruction arithmetic operation device for reconstructing an image from the imaging data after correction arithmetic operation.

24. The MRI system according to claim 23, wherein the data collection control device provides two or more navigation echoes to one shot, and the correction arithmetic operation device matches the polarity of the data collecting read gradient corresponding to imaging data with the polarity of the data collecting read gradient corresponding to correcting data for use in phase correction of the imaging data.

25. The MRI system according to claim 23, wherein the data collection control device provides one navigation echo to one shot so as to determine a correction amount of a motion phase error from the phase of the navigation echo of the shots.

* * * * *

UNITED STATES PATENT AND TRADEMARK OFFICE
CERTIFICATE OF CORRECTION

PATENT NO. : 6,703,834 B2
DATED : March 9, 2004
INVENTOR(S) : Yoshikazu Ikezaki

It is certified that error appears in the above-identified patent and that said Letters Patent is hereby corrected as shown below:

<u>Column 1,</u>
Line 3, add the following:
-- CROSS REFERENCE TO RELATED APPLICATIONS
     This application claims the benefit of Japanese Application No. 2001-106712 filed April 5, 2001. --.

<u>Column 14,</u>
Line 40, after "between" insert -- the navigation echoes of --.

<u>Column 15,</u>
Line 23, delete "claim 9" and insert -- claim 10 --.
Lines 39, 42 and 49, delete "RE" and insert -- RF --.

<u>Column 16,</u>
Line 26, after "claim" insert -- 16 --.

Signed and Sealed this

Thirtieth Day of May, 2006

JON W. DUDAS
*Director of the United States Patent and Trademark Office*